(12) United States Patent
Ishii

(10) Patent No.: US 8,502,910 B2
(45) Date of Patent: Aug. 6, 2013

(54) LIGHT-COLLECTING DEVICE, LIGHT-COLLECTING DEVICE GROUP, AND SOLID-STATE IMAGING APPARATUS

(75) Inventor: Motonori Ishii, Osaka (JP)

(73) Assignee: Panasonic Corporation, Osaka (JP)

( * ) Notice: Subject to any disclaimer, the term of this patent is extended or adjusted under 35 U.S.C. 154(b) by 87 days.

(21) Appl. No.: 13/275,646

(22) Filed: Oct. 18, 2011

(65) Prior Publication Data
US 2012/0033126 A1 Feb. 9, 2012

Related U.S. Application Data

(63) Continuation of application No. PCT/JP2010/002801, filed on Apr. 19, 2010.

(30) Foreign Application Priority Data

Apr. 20, 2009 (JP) ................................. 2009-102498

(51) Int. Cl.
- *H04N 5/225* (2006.01)
- *H04N 9/083* (2006.01)
- *H04N 3/14* (2006.01)
- *H04N 5/335* (2011.01)
- *H04N 9/04* (2006.01)
- *H01L 27/00* (2006.01)
- *H01L 31/0232* (2006.01)
- *G01J 3/50* (2006.01)
- *H01J 5/16* (2006.01)

(52) U.S. Cl.
USPC ........ 348/340; 348/272; 250/208.1; 250/226; 257/432

(58) Field of Classification Search
USPC ....... 348/340, 272; 250/208.1, 226; 257/432
See application file for complete search history.

(56) References Cited

U.S. PATENT DOCUMENTS

| | | | |
|---|---|---|---|
| 4,994,664 A * | 2/1991 | Veldkamp | 250/216 |
| 7,692,129 B2 * | 4/2010 | Toshikiyo et al. | 250/208.1 |
| 7,768,711 B2 | 8/2010 | Ishii et al. | |
| 7,846,620 B2 * | 12/2010 | Ishii et al. | 430/5 |
| 2006/0284052 A1 * | 12/2006 | Toshikiyo et al. | 250/208.1 |
| 2007/0146531 A1 * | 6/2007 | Toshikiyo | 348/340 |
| 2007/0164329 A1 * | 7/2007 | Toshikiyo | 257/291 |
| 2008/0076039 A1 * | 3/2008 | Ishii et al. | 430/5 |
| 2008/0185500 A1 | 8/2008 | Toshikiyo | |
| 2009/0020840 A1 * | 1/2009 | Toshikiyo et al. | 257/432 |
| 2009/0250594 A1 * | 10/2009 | Tanaka et al. | 250/208.1 |
| 2011/0121422 A1 * | 5/2011 | Saitou et al. | 257/432 |
| 2011/0176044 A1 | 7/2011 | Toshikiyo | |

FOREIGN PATENT DOCUMENTS

| | | |
|---|---|---|
| JP | 2001-196568 | 7/2001 |
| JP | 2006-351972 | 12/2006 |
| JP | 2008-192771 | 8/2008 |
| WO | 2005/059607 | 6/2005 |
| WO | 2005/101067 | 10/2005 |

\* cited by examiner

*Primary Examiner* — Sinh Tran
*Assistant Examiner* — Christopher K Peterson
(74) *Attorney, Agent, or Firm* — McDermott Will & Emery LLP

(57) ABSTRACT

A light-collecting device includes at least one first annular region having a first refractive index, and at least one second annular region having a second refractive index different from the first refractive index, the at least one first annular region and the at least one second annular region are adjacently and alternately arranged in a concentric manner, and at least one of the at least one first annular region and the at least one second annular region includes a gap at a portion where a width of the annular region gradually decreases.

14 Claims, 21 Drawing Sheets

US 8,502,910 B2

LIGHT-COLLECTING DEVICE, LIGHT-COLLECTING DEVICE GROUP, AND SOLID-STATE IMAGING APPARATUS

CROSS REFERENCE TO RELATED APPLICATION(S)

This is a continuation application of PCT application No. PCT/JP2010/002801 filed on Apr. 19, 2010, designating the United States of America.

BACKGROUND OF THE INVENTION (1) Field of the Invention

The present invention relates to light-collecting devices, in particular, to a light-collecting device in which a first annular region and a second annular region each having a refractive-index different from each other are adjacently and alternately arranged in a concentric manner, to a light-collecting device group, and to a solid-state imaging apparatus including the light-collecting device group.

(2) Description of the Related Art

An apparatus which converts an image into an electrical signal (the apparatus is called an imaging apparatus) is typically used in equipment electromagnetically recording an image, including digital video recorders, digital still cameras, and camera-equipped cell-phones which are rapidly increasing in recent years. A charge-coupled device sensor (typically, it is called a "CCD sensor". Hereinafter, it is written as a "CCD sensor") and a MOS sensor, which are a type of a semiconductor device, have been used for the imaging apparatus in recent years, contributing to miniaturization and price reduction of the imaging apparatus. In the imaging apparatus, plural minute pixels each having therein a single photodetecting device are arranged on a plane so as to form a single screen. Accordingly, the capability of the imaging apparatus is determined by the capability of these plural pixels.

Among the most important capabilities of the imaging apparatus, is the capability to convert a minute input image into an electrical signal with a low noise (i.e., a low S/N ratio), and the capability to output the input image with a high electrical signal (i.e., a high amplification factor).

As a method for achieving the low S/N ratio and high amplification factor, a method for improving the S/N ratio and amplification factor of the photodetecting device in a pixel is firstly considered. In addition, a below-described method is generally adopted.

FIG. 19 is diagram showing a cross section of a single pixel in a typical solid-state imaging apparatus according to a conventional technique. As shown in FIG. 19, a pixel 1601 includes a photodetecting device 1602, a light-collecting device 1603, a color filter 1604, and a line 1606. Incident light 1605 entering the pixel 1601 is collected by the light-collecting device 1603 and separated by a color, such as red, blue, or green by the color filter 1604, followed by being input into the photodetecting device 1602. The density of light-intensity of the incident light 1605 entering the photodetecting device 1602 is increased by the light-collecting device 1603, thereby enabling the low S/N ratio and improvement of the amplification factor.

Here, an incident angle of the incident light 1605 varies, causing a focal point by the light-collecting device 1603 to vary. This results in the incident light to fail to be collected on the photodetecting device 1602. When the pixel 1601 serves as a peripheral pixel in the imaging apparatus, the above problem remarkably occurs.

In order to solve the above problem, there is a conventional technique in which light-collecting devices are asymmetrically arranged with respect to each of pixels (see the patent reference 2: Japanese Unexamined Patent Application Publication No. 2001-196568). Alternatively, in the peripheral pixels in the imaging apparatus, a position of the photodetecting device 1602 has been conventionally displaced with respect to the light-collecting device. However, in these conventional techniques, there has been a problem that a high effect can be obtained with a relatively small incident angle of the incident light 1605, whereas the effect decreases as the incident angle increases. In addition, a position of the line 1606 also needs to be displaced with respect to the photodetecting device 1602 in accordance with the incident angle of the incident light 1605. However, the position displacement may normally be impossible due to a restriction of a circuit layout (layout rule).

In order to achieve a solution that characteristics of the pixel is maintained even when the incident angle is large, the patent reference 1 (International Patent Publication No. WO 2005/101067) discloses the light-collecting device formed as shown in FIG. 20A. The pixel shown in FIG. 20A includes a plurality of annular-shaped light-transmitting films 1501, a substrate 1502, a photodetecting device 1504, and a line 1506. The light-transmitting films 1501 are formed in a circular shape or the annular shape in a concentric manner. A width of the annular region is at a level of a wavelength of a natural light or narrower than that. A typical width is at a level of 0.1 μm. The refractive index reacting on the incident light 1505 passing through the light-transmitting film 1501 falls in an averaged value in the range of the wavelength on a surface of the light-transmitting film 1501, but does not fall in the value of the refractive index of the light-transmitting film 1501 or of a medium (typically, air). Since the annular region is extremely narrow in width, the refractive index reacting on the incident light 1505 depends on the width of the annular region. Accordingly, the refractive index falls in an intermediate value between the refractive index of the light-transmitting film 1501 and that of the medium. Specifically, for the incident light 1505, the refractive index is concentrically spread on a surface of the light-transmitting film 1501. Appropriate arrangement of the spread of the refractive index allows the incident light 1505 having passed through the light-transmitting film 1501 and the substrate 1502 to be collected by the diffraction effect so as to reach the photodetecting device 1504. A position where the incident light 1505 is collected can be controlled by varying a shape of the light-transmitting film 1501. Accordingly, the incident light can be collected in the photodetecting device 1504 without deteriorating the capability thereof by designing the shape of the light-transmitting film 1501 taking the incident angle of the incident light 1505 into account. Therefore, the above-mentioned solution can be achieved.

FIG. 20B is a top view of FIG. 20A. The reference numerals 1501 and 1507 respectively denote the light-transmitting film and the medium each having an annular shape and being concentrically arranged.

SUMMARY OF THE INVENTION

However, if the configuration shown in FIG. 20B is realized with normal manufacturing steps of a semiconductor device, a following problem arises.

The light-transmitting film 1501 and the medium 1507 are cut out along an outer periphery of a square-shaped region which corresponds to a single pixel (although the square is raised as an example in this description, a rectangular shape or other shapes may be included).

Upon the cutout along the outer periphery of the square region, a minimal portion denoted by 1508 presents a problem. A width of the minimal portion 1508 in a lateral direction has a possibility to unlimitedly decrease depending on a position relationship of the outer periphery and the center of the light-collecting device.

Lithography is used to produce a desired configuration. However, the producible minimum size is determined based on a wavelength of an exposing source in the lithography. Accordingly, there arises a first problem that unlimitedly small structure cannot be realized. Supposing that the width of the minimal portion 1508 in the lateral direction has a size equal to or smaller than the minimum size, a mask pattern like FIG. 20B is intended to be formed and exposed. However, a configuration around the minimal portion 1508 only distorts or disappears. Accordingly, the configuration as shown in FIG. 20B cannot be formed.

As a second problem, a structure and/or a configuration obtained by the normal manufacturing steps of the semiconductor device typically has certain variability. If a smaller structure and/or configuration with respect to the variability is intended to be formed, the structure and/or configuration may appear or disappear, and thus cannot be controlled to either appearing or disappearing.

In the case of the lithography, for example, variability of light intensity and unevenness and/or curvature of an upper surface of a wafer at the time of exposure cause variability to occur in the transferred configuration after the exposure. As a result, if the configuration shown in FIG. 20B is to be formed, the configuration of the minimal portion 1508 widely varies, specifically, the configuration thereof disappears or distorts.

As described above, there is a problem that the light-collecting device disclosed in the patent reference 1 includes a structure like the minimal portion 1508 which cannot be stably formed in the normal manufacturing steps of semiconductor device. The configuration of such structure widely varies, precluding a step-management or decreasing a yield. This results in wide variability in the characteristics of the light-collecting device.

In view of the above problems, an object of the present invention is to provide a light-collecting device which can stably be formed in normal manufacturing steps of a semiconductor device, and prevents yield decrease and characteristic variability due to configuration variability of the light-collecting device, a light-collecting device group, and a solid-state imaging apparatus.

In order to solve the above problem, a light-collecting device according to an aspect of the present invention includes at least one first annular region having a first refractive index, and at least one second annular region having a second refractive index different from the first refractive index, the at least one first annular region and the at least one second annular region are adjacently and alternately arranged in a concentric manner, and at least one of the at least one first annular region and the at least one second annular region includes a gap at a portion where a width of the annular region gradually decreases.

According to the configuration, the first annular region includes the gap. Therefore, the width of the first annular region can be prevented from being equal to or narrower than the minimum size that is producible in a manufacturing process. This prevents the shape of the first annular region from distorting or disappearing. In addition, decrease of yield and variability of characteristics due to variability of the shapes of the light-collecting devices can be prevented. Furthermore, as for a variance amount in the manufacturing process, a structure and/or configuration too small to be controlled can be avoided, thereby enabling the stable production in usual steps of manufacturing a semiconductor device.

At least one of the at least one first annular region and the at least one second annular region may have a two-stage configuration, and the gap may be provided in a lower stage or an upper stage of the two-stage configuration.

Opposing end surfaces of the gap may be approximately parallel to each other.

The at least one first annular region may be made of a material having a high-refractive index higher than a refractive index of air, the at least one second annular region may be formed by the air, at least one of the at least one first annular region may include the gap, and the gap may be an air gap and connected to an adjacent one of the at least one second annular region.

According to the configuration, the first annular region includes a portion whose width gradually decreases in size, and the portion is replaced with the air gap. This solves the above problems that the decrease of the yield and the variability of characteristics due to the variability of the shape of the light-collecting device should be prevented.

The at least one first annular region may be made of a material having a high-refractive index higher than a refractive index of air, the at least one second annular region may be formed by the air, at least one of the at least one second annular region may include the gap, and the gap may be filled with the material having the high-refractive index and connected to an adjacent one of the at least one first annular region.

According to the configuration, the first annular region includes the gap whose width gradually decreases in size is filled with the high-refractive index material. This solves the above problems that the decrease of the yield and variability of characteristics due to the variability of the shape of the light-collecting device should be prevented.

An area of the gap may be equal to or less than 3% of an area of the light-collecting device.

A light-collecting device group according to an aspect of the present invention may include: a first light-collecting device which is the above-described light-collecting device; and a second light-collecting device including at least one first annular region having a first refractive index, and at least one second annular region having a second refractive index different from the first refractive index, the second light-collecting device does not include the gap, the at least one first annular region and the at least one second annular region may be adjacently and alternately arranged in a concentric manner, and the first light-collecting device and the second light-collecting device may be arranged adjacent to each other across a boundary.

A light-collecting device group according to another aspect of the present invention may include at least the first light-collecting device and the second light-collecting device each of which is the above-described light-collecting device, and a length of the gap of the first light-collecting device may be different from a length of the gap of the second light-collecting device.

The light-collecting device group may include a plurality of the light-collecting devices, and a length of the gap in a predetermined number of the light-collecting devices arranged in a line may vary monotonically.

The light-collecting device group may include: a first light-collecting device which is the above-described light-collecting device; and a second light-collecting device including at least one first annular region having a first refractive index, and at least one second annular region having a second refractive index different from the first refractive index, the second light-collecting device does not include the gap, the at least one first annular region and the at least one second annular region may be adjacently and alternately arranged in a concentric manner, and the first light-collecting device and the second light-collecting device may be adjacently arranged.

The length of the gap of the first light-collecting device may be different from a length of the gap of the second light-collecting device.

In the light-collecting device group, a length of the each gap in a predetermined number of the light-collecting devices arranged in a line may vary monotonically.

A solid-state imaging apparatus according an aspect of the present invention includes: an imaging area including a plurality of light-receiving devices; and a plurality of light-collecting devices respectively associated with the light-receiving devices, and the light-collecting devices include the above-described light-collecting device.

A center position of each of the light-collecting devices may be displaced from a center position corresponding one of the light-receiving devices, an amount of the displacement may depend on a position of the light-collecting device in the imaging area, and a length of the gap may depend on the position of the light-collecting device in the imaging area.

A light-collecting device according to an aspect of the present invention is provided with the above-described configuration and can be stably produced in normal steps of manufacturing a semiconductor device. With the light-collecting device, the shape of the first annular region is prevented from distorting and disappearing, and the yield decreasing and the characteristics variability due to the variability of the shape of the light-collecting device can also be prevented.

FURTHER INFORMATION ABOUT TECHNICAL BACKGROUND TO THIS APPLICATION

The disclosure of Japanese Patent Application No. 2009-102498 filed on Apr. 20, 2009 including specification, drawings and claims is incorporated herein by reference in its entirety.

The disclosure of PCT application No. PCT/JP2010/002801 filed on Apr. 19, 2010, including specification, drawings and claims is incorporated herein by reference in its entirety.

BRIEF DESCRIPTION OF THE DRAWINGS

These and other objects, advantages and features of the invention will become apparent from the following description thereof taken in conjunction with the accompanying drawings that illustrate a specific embodiment of the invention. In the Drawings.

DESCRIPTION OF THE PREFERRED EMBODIMENT(S)

Hereinafter, an embodiment according to the present invention will be described.

A light-collecting device according to an embodiment of the present application includes at least one first annular region having a first refractive index and at least one second annular region having a second refractive index different from the first refractive index. The first annular region and the second annular region are adjacently and alternately arranged in a concentric manner. Each of the first and second annular regions has a width at a level of or narrower than a wavelength of incident light. This enables a lens function of the light-collecting device.

At least one of the first annular regions or at least one of the second annular regions includes a gap in a portion where the width of the annular region gradually decreases. This gap prevents the width of the first annular region from decreasing in a size equal to or smaller than the minimum size producible by a manufacturing process. In addition, opposing end surfaces of the gap are provided approximately parallel to each other. Specifically, the gap is defined in such a manner that a part of the annular region is lacked approximately in parallel with the width direction thereof. Such gap can easily be defined by an existing manufacturing process.

Hereinafter, a specific embodiment will be described with reference to drawings. In the following drawings, the same reference denotes the same structural element.

Embodiment 1

As for Embodiment 1, a configuration will be described in which a first annular region is made of a material having a high refractive index higher than that of air, a second annular region is formed by the air, and a gap is an air gap and connected to an adjacent one of the at least one second annular region.

Figure 1:
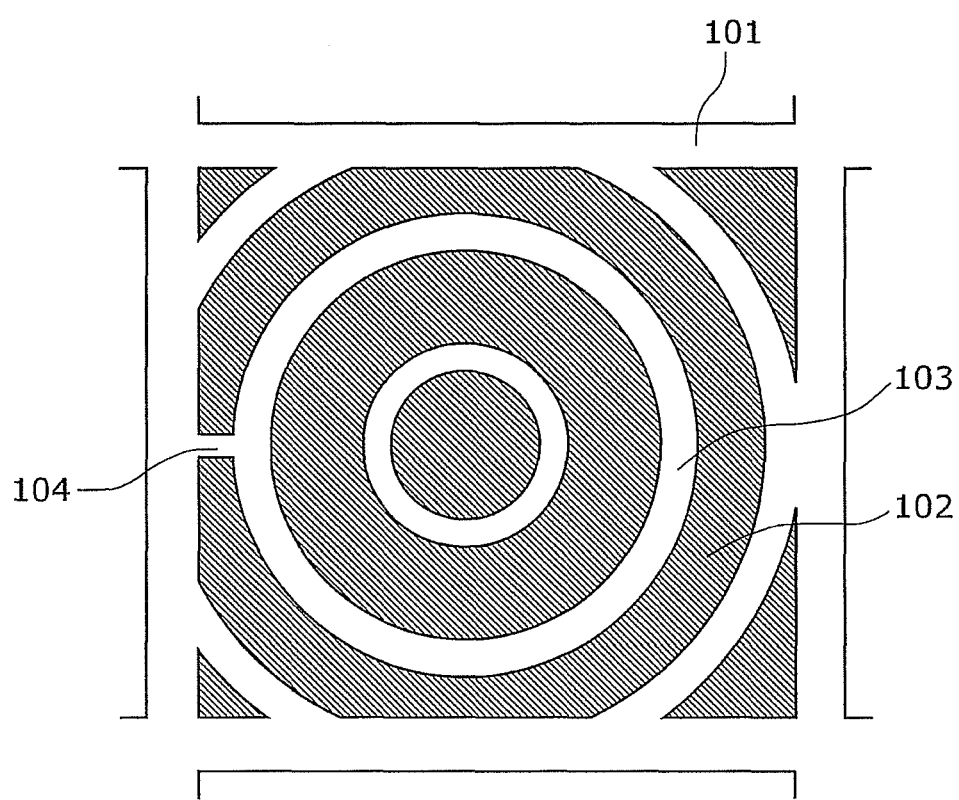
FIG. 1 is a top view showing a configuration of a light-collecting device according to Embodiment 1 of the present invention.

FIG. 1 is a top view showing a configuration of a light-collecting device according to Embodiment 1 of the present invention. The light-collecting device in FIG. 1 is separated from adjacent other light-collecting devices by a pixel-end air gap 101, and includes a pixel-inside high refractive index portion 102 serving as the second annular region, a pixel-inside air gap 103 serving as the first annular region, and an air gap 104. The pixel-inside air gap 103 and the pixel-inside high refractive index portion 102 each have an approximately circular shape, and are concentrically arranged. The center of the concentric circles may correspond to the center of a pixel, or may not correspond thereto (may be eccentric with respect to the center of the pixel). Here, each of the pixel-end air gap 101, the pixel-inside air gap 103, and the air gap 104 is made of a material having a refractive index lower than that of the pixel-inside high refraction portion 102 (hereinafter, it is denoted as a low-refractive index material). A combination of air and a silicon dioxide film is used as a typical combination of material for the low-refractive index material and a material of the pixel-inside high refractive index portion 102, respectively. Alternatively, a combination of air and TiO2 may be used. Further, a combination of air and a silicon nitride film may be used. Still further, a combination of a silicon dioxide film and the TiO2 may be used. Any combination may be used in principle without being limited in these materials, as long as the refractive index of the low-refractive index material is smaller than the refractive index of the material of the pixel-inside high refractive index portion 102.

Figure 2:
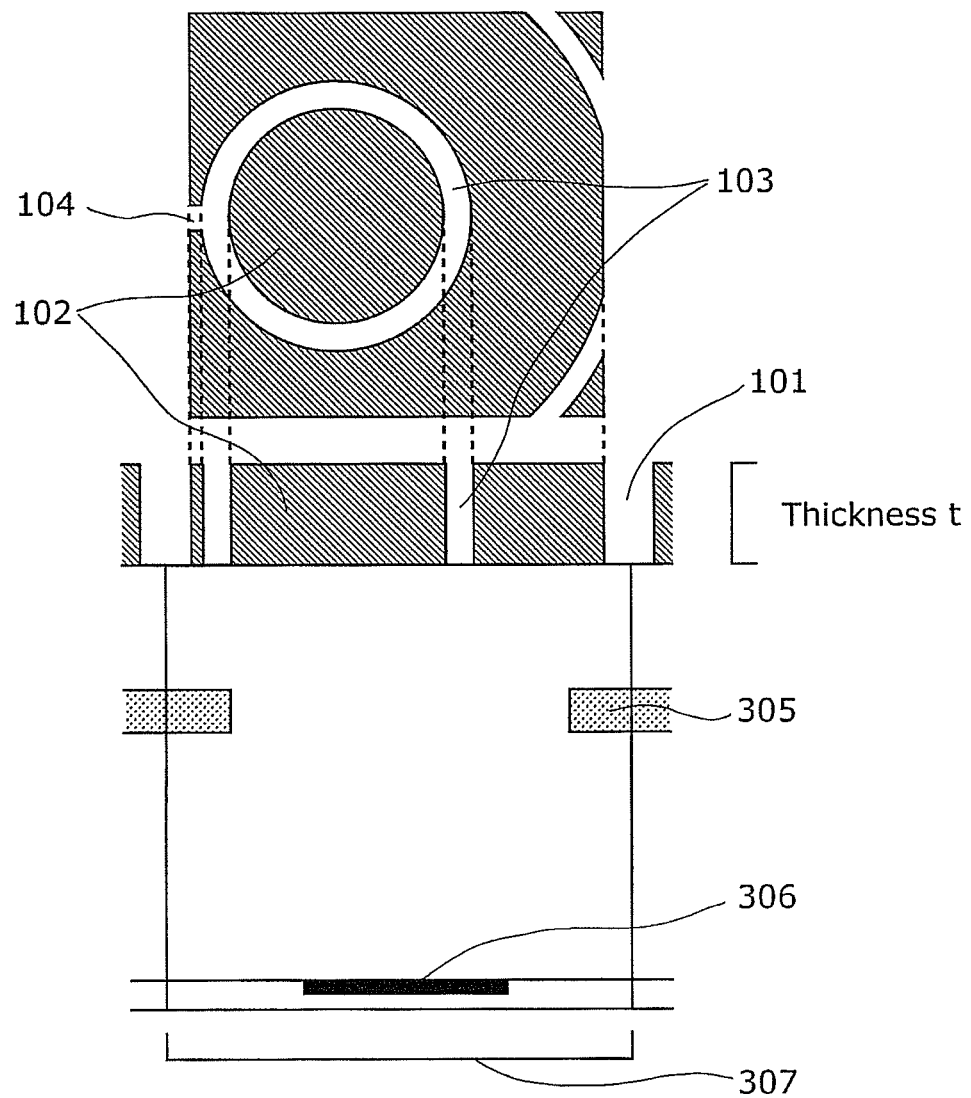
FIG. 2 includes a top view showing the light-collecting device and a cross sectional view showing a pixel according to Embodiment 1 of the present invention.

FIG. 2 includes a top view showing the light-collecting device and a cross sectional view showing a pixel according to Embodiment 1 of the present invention shown in FIG. 1. A pixel 307 includes a light-receiving portion 306, a light-shielding film 305, and the light-collecting device. The light-shielding film 305 occasionally serves as a line. The light-receiving portion 306 is normally provided with a photodetecting device (typically, a photodiode). In addition to the above, other structural constituent, such as a color filter, may be included. The pixel 307 includes these elements.

A typical length of a side of the pixel 307 is at a level of 6 μm to 1 μm. The minimum width of the pixel-inside air gap 103 is at a level of 0.1 μm. The minimum width of the pixel-inside high refractive index portion 102 is the same with that of the pixel-inside air gap 103. The width of the pixel-end air gap 101 is at a level of 0.1 μm to 1 μm. However, these minimum sizes depends on a manufacturing device (depends on an exposing device, for example), and other sizes may be usable. The minimum size shown in the above is applied in a case when KrF is used as light for the exposure. Furthermore, when the silicon dioxide film is used as the high-refractive index material and air is used as the low-refractive index material, thickness of the pixel-inside high refractive index portion 102 (denoted by "t" in FIG. 2) is about 1.2 μm. However, the invention is not limited to the above.

The light-collecting device according to Embodiment 1 of the present invention, which is shown in FIGS. 1 and 2, can be produced by steps described below, for example. First, a structure below a bottom surface of the light-collecting device is prepared in a typical manufacturing step of a solid-state photodetecting device. After that, the high-refractive index thin film, which is to serve as a base of the pixel-inside high refractive index portion 102, is laminated on the obtained structure. Next, a photoresist is further laminated on the laminated high-refractive index thin film, and exposed and developed by an exposing device including a scanner and a stepper. After that, the high-refractive index thin film is etched by means, such as a dry etching processing, so that the photoresist is removed, and finally the light-collecting device is accomplished. The manufacturing method, however, is not limited to the above.

In FIG. 1, the air gap 104 is provided in the pixel-inside high refractive index portion 102 in the vicinity of a portion where the pixel-inside air gap 103 approaches the pixel-end air gap 101. The air gap 104 reduces the width of the pixel-inside high refractive index portion 102 in the diameter direction, avoiding the light-collecting device from reaching a size which cannot be produced by semiconductor manufacturing steps.

Embodiment 2

In Embodiment 1, an example is described in which air gap is provided as a gap in a first annular region, whereas an example will be described in which the gap is provided in a second annular region in Embodiment 2. In this case, the gap is filled with a high-refractive index material and connected to adjacent one of the at least one first annular region.

Figure 3:
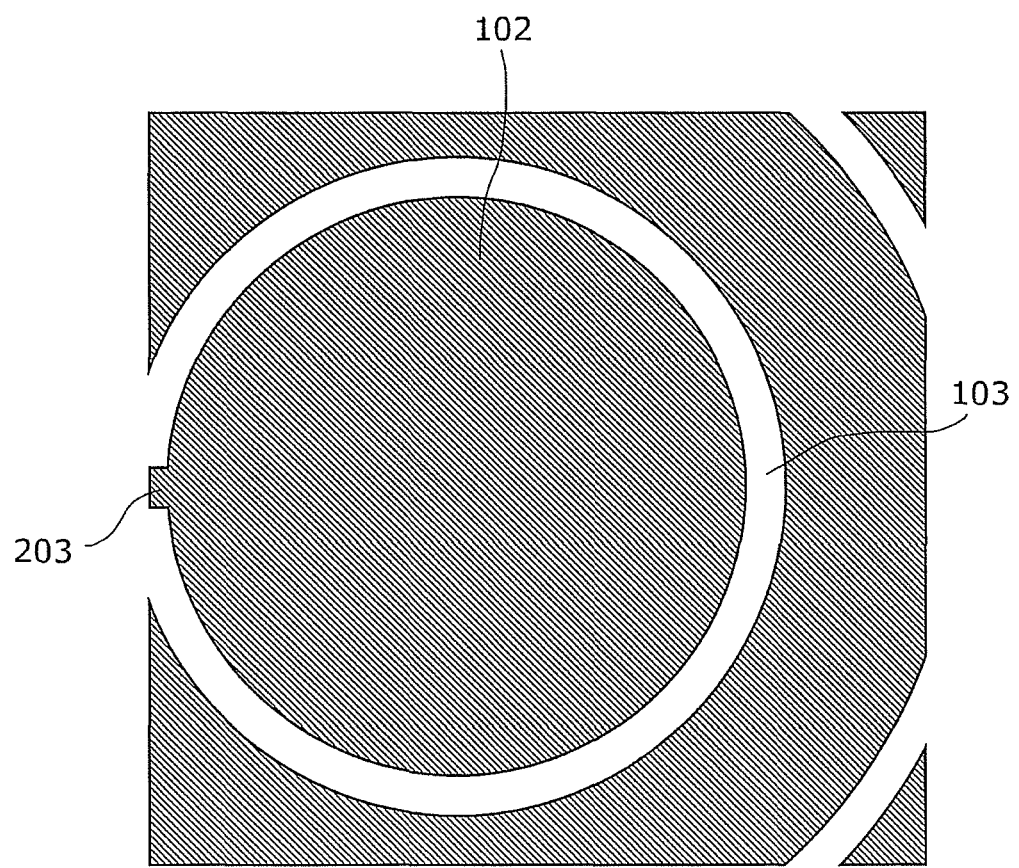
FIG. 3 is a top view showing a configuration of a light-collecting device according to Embodiment 2 of the present invention.

FIG. 3 is a top view showing a configuration of a light-collecting device according to Embodiment 2 of the present invention. The light-collecting device shown in FIG. 3 is different from that shown in FIG. 1 in that a gap 203 is provided instead of the air gap 104. The gap 203 has a convex shape projecting outward from a center of the light-collecting device, and is made of the high-refractive index material. The pixel-inside air gap 103 and the pixel-inside high refractive index portion 102 each have an approximately circular shape, and are concentrically arranged. The center of the concentric circles may correspond to the center of a pixel, or may not correspond thereto (may be eccentric with respect to the center of the pixel). Material, size, manufacturing method, and the like are the same as those described in Embodiment 1.

In FIG. 3, the gap 203 filled with the high-refractive index material is arranged in the vicinity of a portion where the pixel-inside high refractive index portion 102 approaches a pixel-end portion in an area of the pixel-inside air gap 103. The arrangement of the gap 203 reduces the width of the pixel-inside air gap 103 in the diameter direction, avoiding the light-collecting device from reaching a size which cannot be produced by semiconductor manufacturing steps.

Embodiment 3

Figure 4:
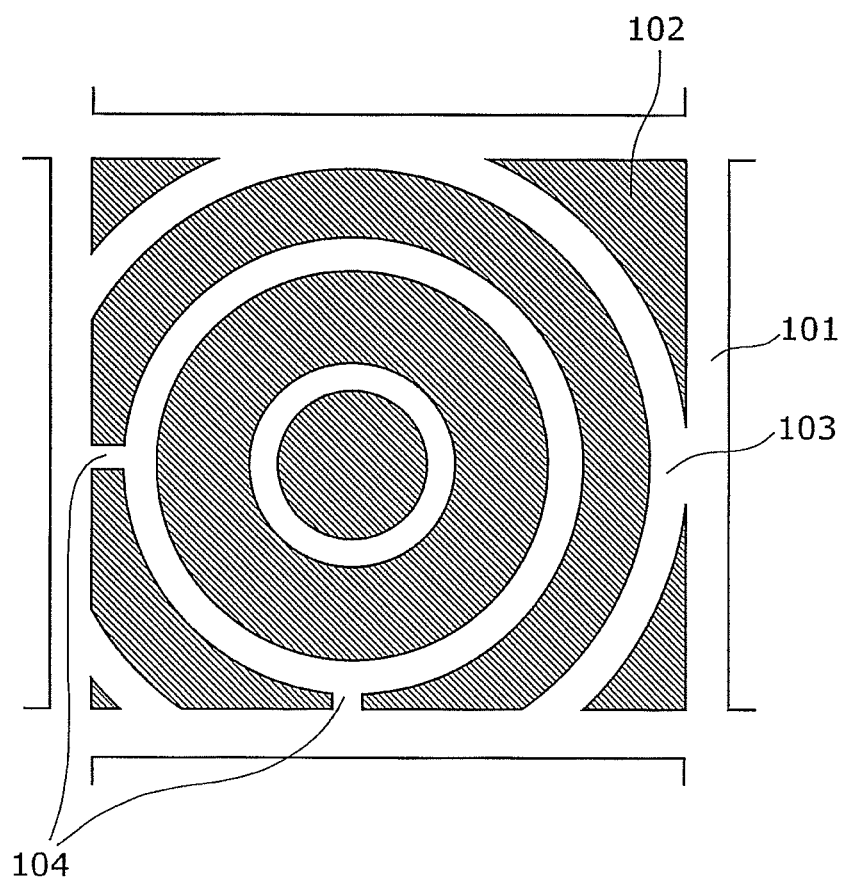
FIG. 4 is a top view showing a light-collecting device according to Embodiment 3 of the present invention.

FIG. 4 is a top view showing a light-collecting device according to Embodiment 3 of the present invention. In FIG. 4, the pixel-inside air gap 103 and the pixel-inside high refractive index portion 102 each have an approximately circular shape, and are concentrically arranged.

In FIG. 4, the center of the concentric circles is displaced in an oblique direction with respect to the center of a pixel. In this case, the air gaps 104 are arranged in respective two portions as shown in FIG. 4, avoiding the light-collecting device from decreasing a size which cannot be produced in semiconductor manufacturing steps.

Embodiment 4

Figure 5:
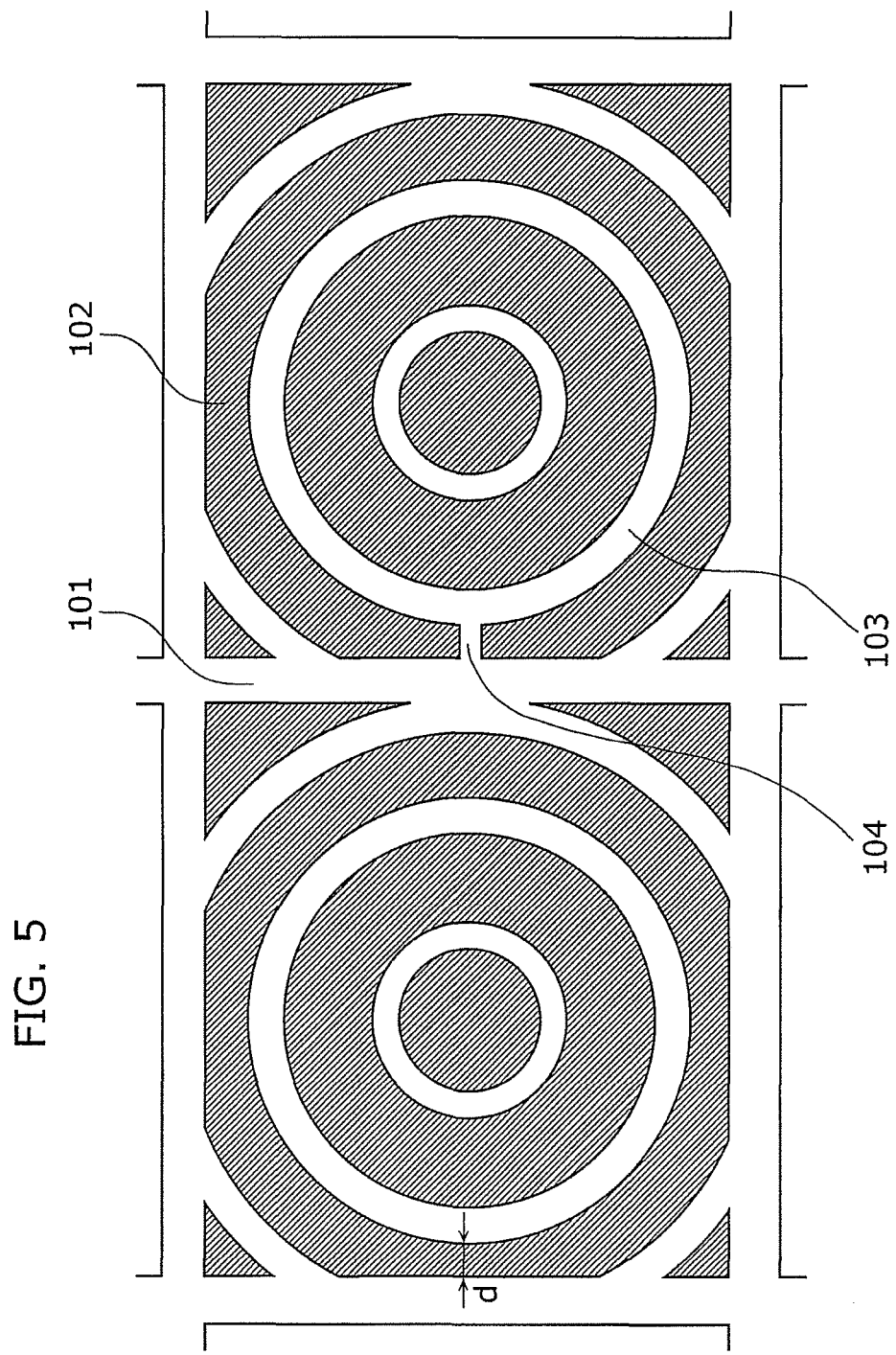
FIG. 5 is a top view showing a light-collecting device group according to Embodiment 4 of the present invention.

FIG. 5 is a top view showing a light-collecting device group according to Embodiment 4 of the present invention. In FIG. 5, the light-collecting device mounted on a left pixel has no air gap 104, whereas the light-collecting device mounted on a right pixel has the air gap 104. This is because the light-collecting device mounted on the left pixel has the center of concentric circles at a position which is relatively close to the center of the pixel, whereas the light-collecting device on the right pixel has the center of the concentric circles at a position which is relatively far from the center of the pixel. In the case when the center position of the concentric circles varies in each pixel, as described above, the light-collecting device can be stably produced with high yield by determining whether or not the air gap 104 is arranged, in the following manner.

The distance "d" shown in FIG. 5 should be focused. The air gap 104 may be arranged in the position where the following formula is satisfied: $d<k1\lambda/NA$. Here, NA denotes the number of openings of an exposing device, $\lambda$ denotes an exposure wavelength, and k1 denotes a proportionality coefficient. When a KrF scanner and the phase shift mask are used as the exposure device, the right side becomes about 0.1 μm.

If the above is set aside and the air gap 104 is not arranged in a position where the above formula is valid, bridge or disappearance of the resist occurs at the position. Accordingly, the light-collecting device cannot be produced, realistically. In practice, the minimum size of "d" should be determined with a margin for the above formula. When the KrF scanner is used, it has been found that the light-collecting device can be stably produced with a value at a level of 0.2 μm in the right side of the formula.

If the air gap 104 excessively becomes large, the addition of the air gap 104 affects on characteristics of the light-collecting device, causing the deterioration of the characteristics, and the like. Accordingly, as a precaution, an area of the air gap 104 is desirably retained at a level of equal to or less than 3% of an area of the pixel.

Embodiment 5

Figure 6:
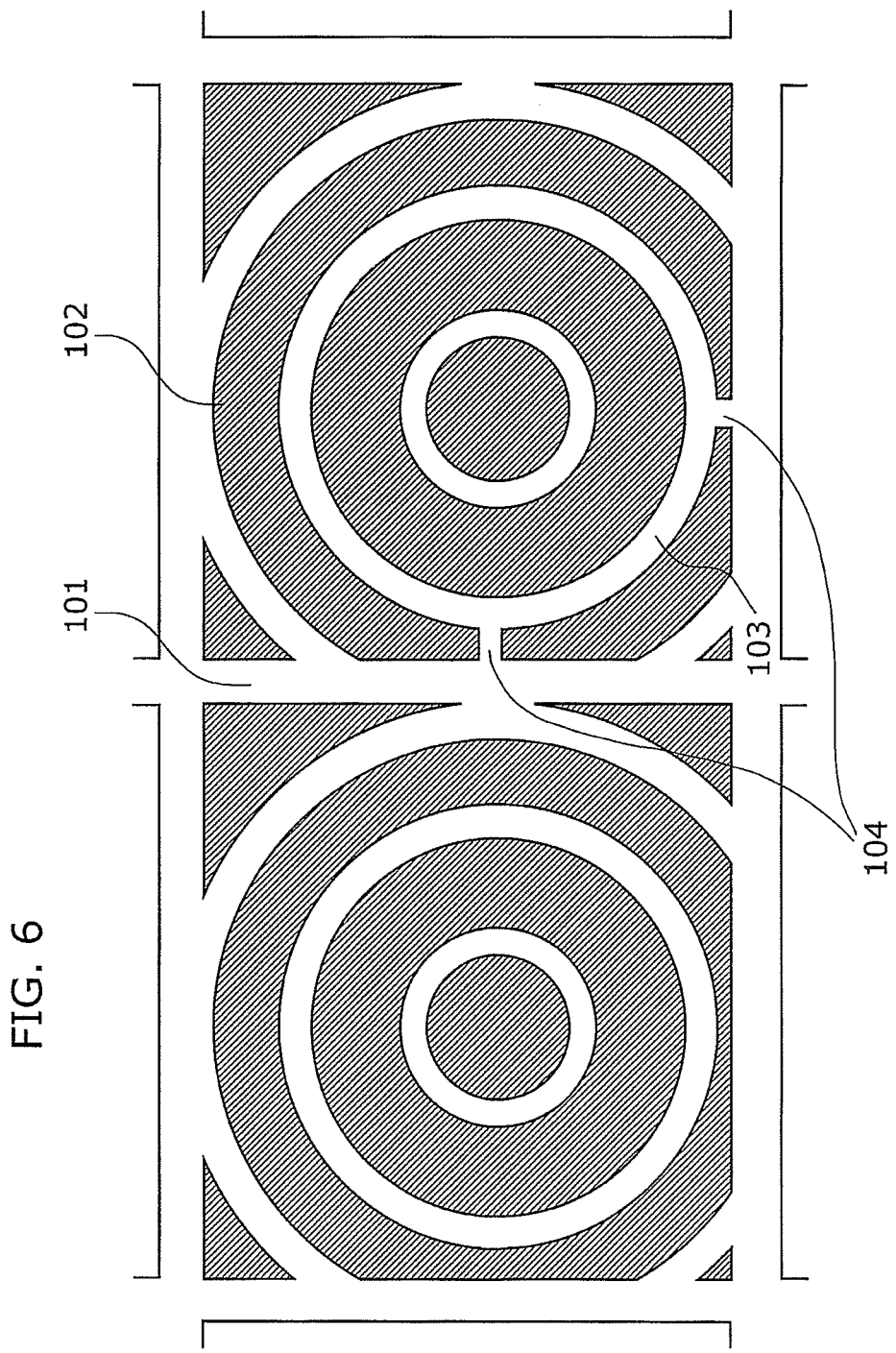
FIG. 6 shows a light-collecting device according to Embodiment 5 of the present invention.

FIG. 6 shows a light-collecting device according to Embodiment 5 of the present invention. In the present embodiment, the center of concentric circles is obliquely displaced with respect to the center of a pixel. Accordingly, air gaps 104 need to be arranged at respective two portions. Others are the same with those in Embodiment 4.

Embodiment 6

Figure 7:
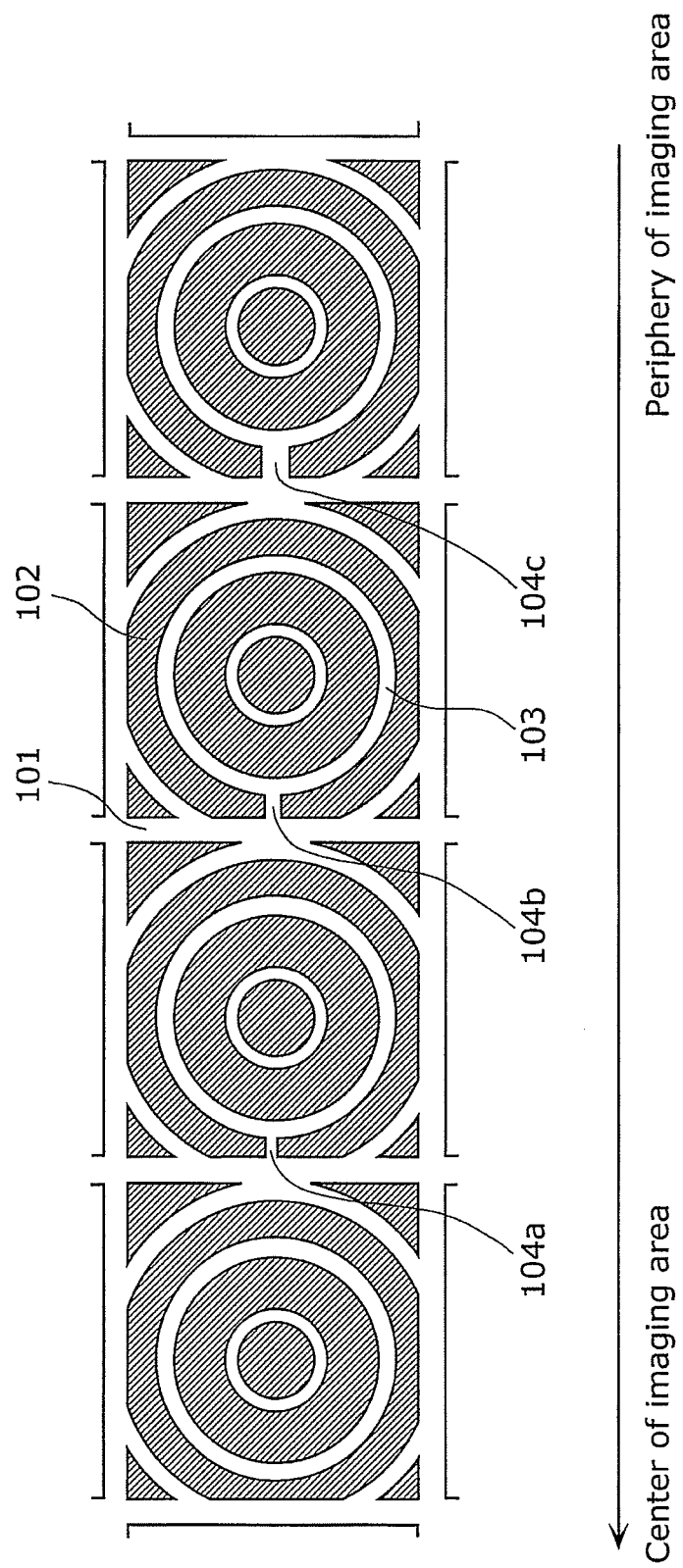
FIG. 7 shows a light-collecting device group according to Embodiment 6 of the present invention.

FIG. 7 shows a light-collecting device group according to Embodiment 6 of the present invention. FIG. 7 shows an extracted part of a plurality of light-collecting devices according to an embodiment of the present invention. The light-collecting devices are disposed on an actual solid-state imaging apparatus. The solid-state imaging apparatus typically has a structure in which pixels are two-dimensionally arranged and the light-collecting device is mounted on the uppermost part of each pixel. In a typical camera system, an optical lens for imaging is placed above the solid-state imaging apparatus. An image desired to be took from the outside is projected on the solid-state imaging apparatus. Since the projected image is wide, an angle of a main incident light beam entering in each pixel varies according to a position of the pixel. The angle of the incident light entering the pixel positioned at the center of a solid-state photodetecting device is perpendicular to the solid-state photodetecting device. However, as the position of the incidence displaces toward a periphery of the solid-state photodetecting device, the incident light inclines. In order to cope with the above, the center position of the light-collecting device is allowed to gradually move, so that the incident light is guided to a light-receiving surface in each pixel.

At this time, as the center position gradually moves, the respective widths of air gaps 104a, 104b, and 104c are allowed to gradually vary, thereby enabling a stable manufacturing without deteriorating characteristics of the light-collecting device.

Although the light-collecting devices adjacent to each other in the lateral direction are shown in this embodiment, same approach should be applied to the case of longitudinal adjacency and oblique adjacency.

It should be noted that the above described solid-state imaging apparatus is not limited to those having a function of taking a still image or a moving image, but may include those having a photodetecting function of simply detecting presence or absence of light and variation thereof.

Embodiment 7

Figure 8:
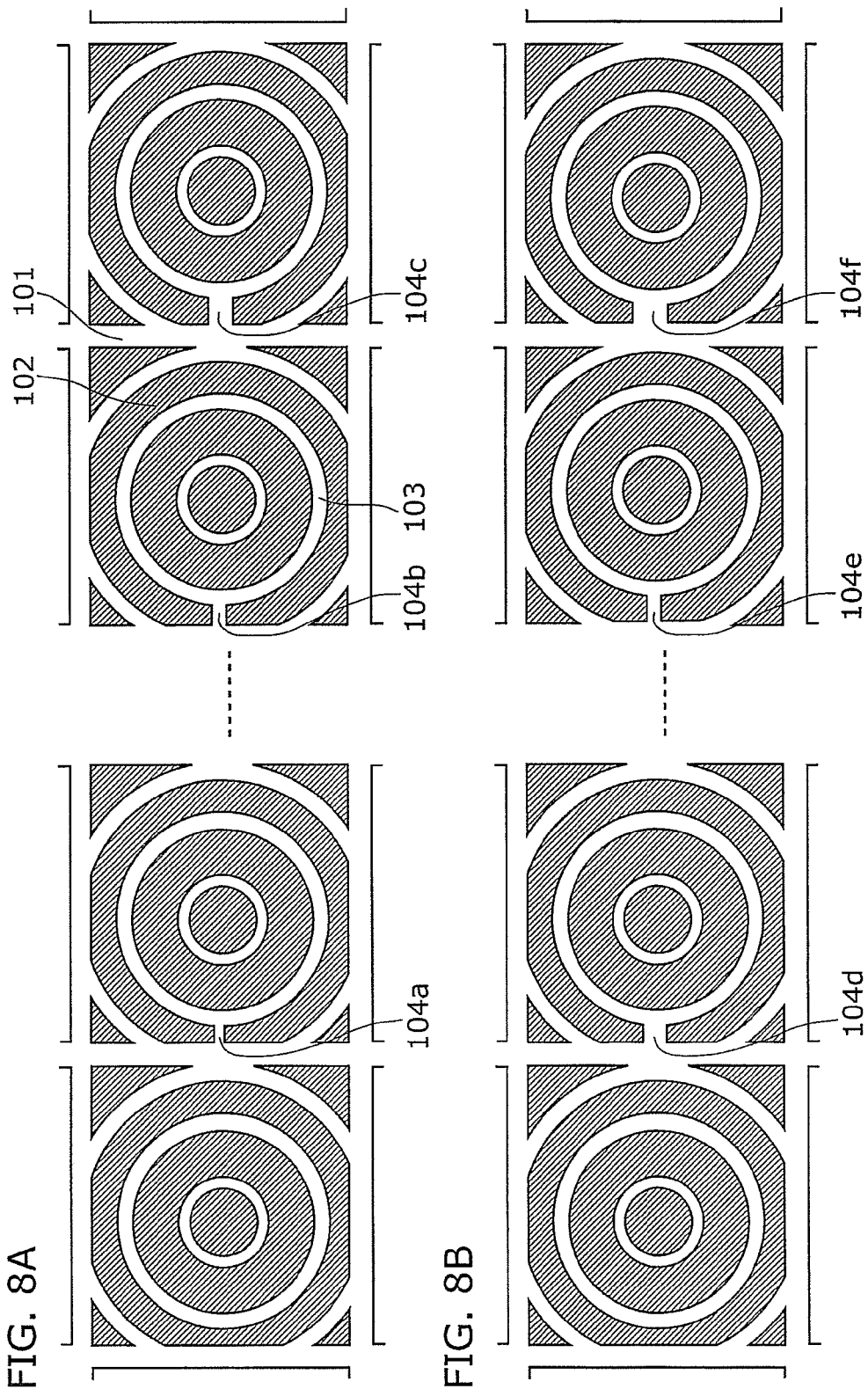
FIGS. 8A and 8B are top views, each of which shows a light-collecting device group according to Embodiment 7 of the present invention.

FIG. 8 is a top view showing a light-collecting device group according to Embodiment 7 of the present invention. This diagram shows the light-collecting devices for four pixels. In the light-collecting device arranged in each of the pixels, the pixel-inside air gap 103 and the pixel-inside high refractive index portion 102 each have an approximately circular shape, and are concentrically arranged. FIG. 8A shows an air gap 104a which is arranged in the manner described in Embodiment 6. Specifically, the width of each of the air gaps increases as a viewpoint shifts toward right in the order of 104a, 104b, and 104c. On the other hand, in FIG. 8B, though the arrangement of the air gaps is approximately same with those in FIG. 8A, the width of each of the air gaps do not necessarily increase as the pixel is viewed toward the right. However, an air gap 104f has the width wider than that an air gap 104d has. Accordingly, it can be recognized that the width of the air gap increases as the pixel is viewed toward the right like in FIG. 8A, taking a broad view on the four pixels in FIG. 8B. As described in the above, same effect with those in Embodiment 6 can be obtained if the width of the air gap does not monotonically vary locally, but monotonically varies in a broad sense, i.e., a length of each gap in a predetermined number of the light-collecting devices aligned in a line varies monotonically. However, the arrangement method of the air gaps described in Embodiment 7 is considerably different from that described in Embodiment 6, causing unevenness and a noise to be superimposed on an output image from the solid-state imaging apparatus. Accordingly, an attention is required.

Figure 21:
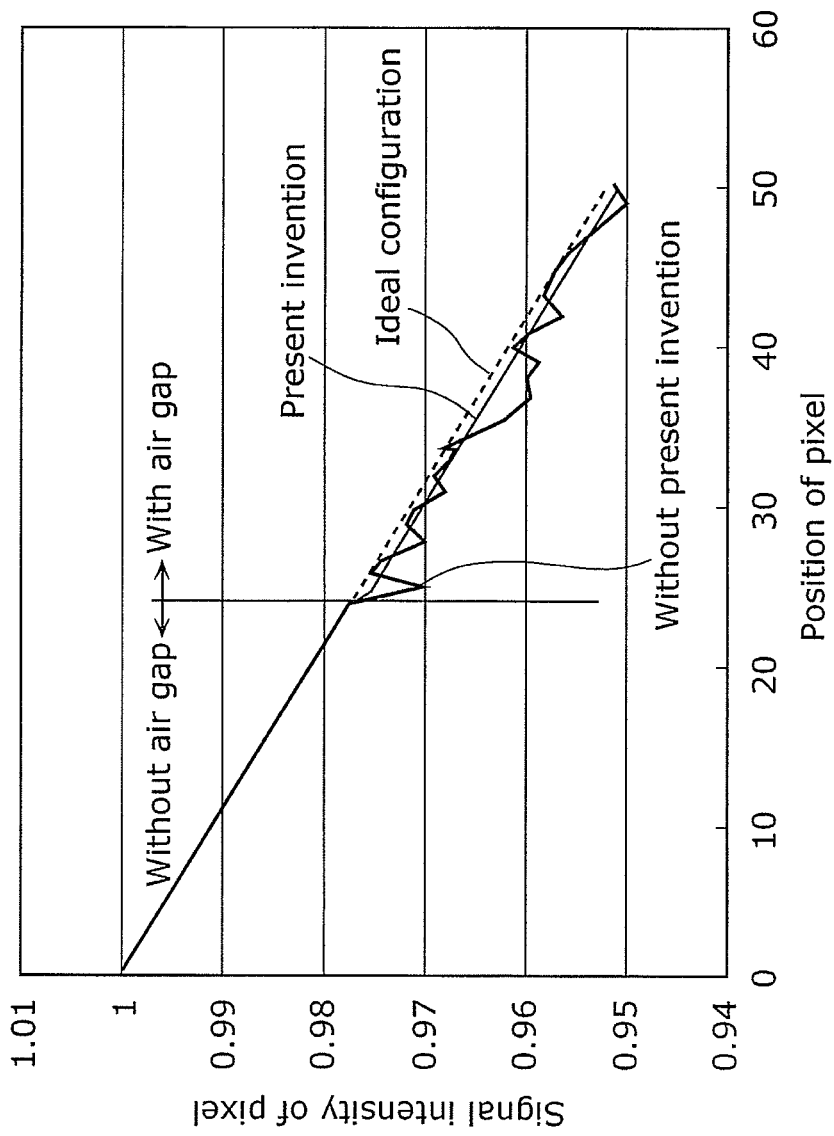
FIG. 21 shows an effect of Embodiment 7 of the present invention.

FIG. 21 is a diagram showing an effect of the invention relating to the light-collecting device group according to Embodiment 7 of the present invention. When the size of the light-collecting device is set to a 5.6 μm square, and the minimum size of the air gap is set to 200 μm width and 150 μm length, FIG. 21 shows fluctuation of signal intensity in each pixel. The horizontal axis indicates a position of the pixel. In detail, it shows, in a pixel unit, coordinates that indicate the position of the pixel viewed on the solid-state imaging apparatus from the center thereof toward the outside. The vertical axis indicates the signal intensity and is standardized with the signal intensity of the pixel at the coordinates of "0".

Supposing that, for example, the light-collecting device group having an identical configuration can be manufactured, consideration will be given to a case where the signal intensity linearly decreases as shown in FIG. 21. If an embodiment of the present invention is applied to the above case, the signal intensity discontinuously fluctuates prior to and after introduction of the air gap. However, when the air gap is sufficiently minimized, an amount of the discontinuity can be reduced at a level that is invisible on an output image (less than about 1% in this case). On the other hand, when Embodiment of the present invention is not applied to the above case, it is predicted that a configuration becomes unstable. Accordingly, the obtained characteristics are not monotonic like the characteristics shown in FIG. 21. This can be confirmed on the output image as roughness.

Embodiment 8

Figure 9:
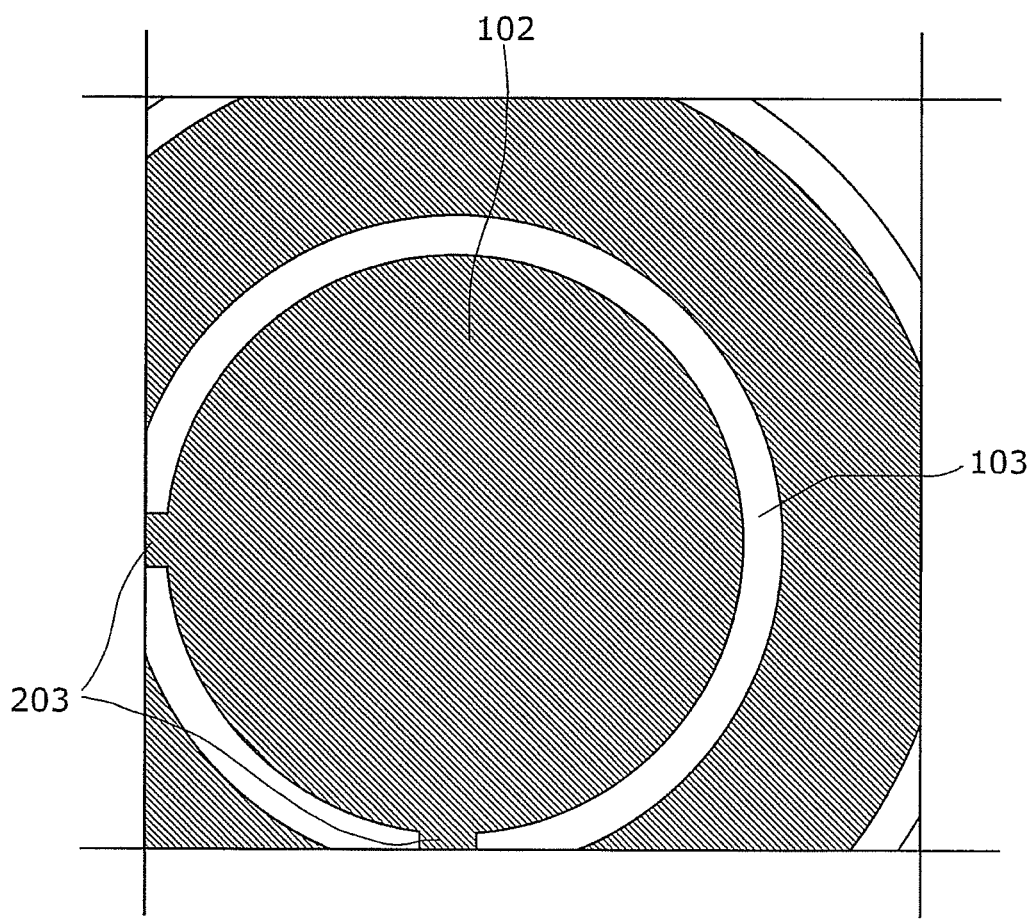
FIG. 9 is a top view showing a light-collecting device according to Embodiment 8 of the present invention.

FIG. 9 is a top view showing a light-collecting device according to Embodiment 8 of the present invention. The pixel-inside air gap 103 and the pixel-inside high refractive index portion 102 each have an approximately circular shape, and are concentrically arranged.

In FIG. 9, the center of the concentric circles is displaced in an oblique direction with respect to the center of a pixel. In such case, the gaps 203 filled with a high-refractive index material are arranged at respective two portions as shown in FIG. 9, avoiding a light-collecting device from reaching a size which cannot be produced in semiconductor manufacturing steps.

Figure 10:
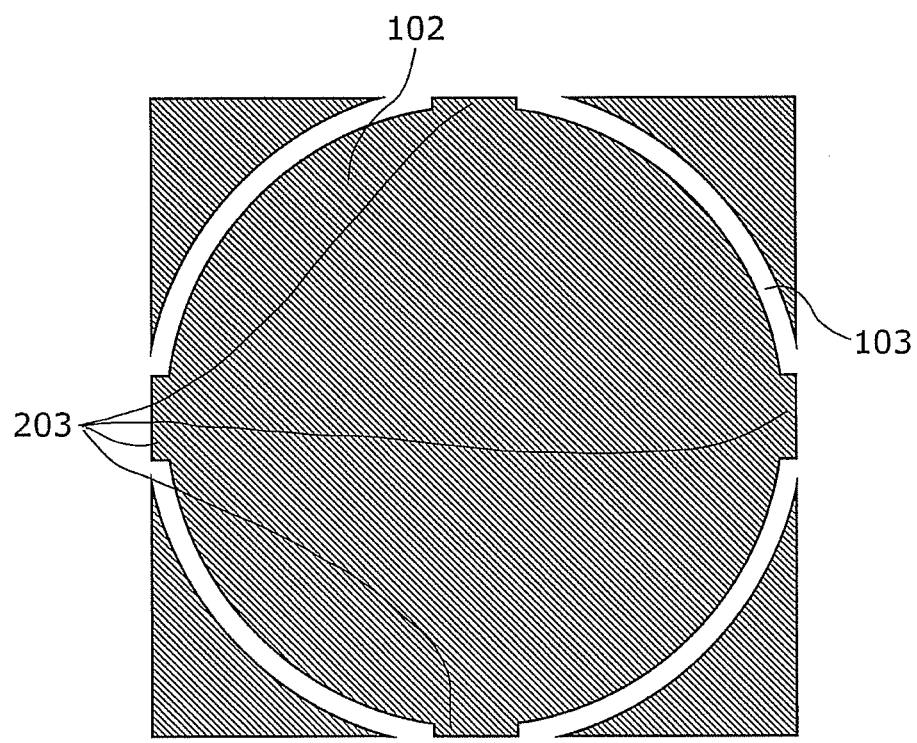
FIG. 10 shows another example of the light-collecting device according to Embodiment 8 of the present invention.

FIG. 10 shows another example of the light-collecting device according to Embodiment 8 of the present invention. The pixel-inside air gap 103 and the pixel-inside high refractive index portion 102 each have an approximately circular shape, and are concentrically arranged. In the light-collecting device shown in FIG. 10, the gaps 203 filled with the high refractive-index material come into contact with a pixel boundary at up, down, left, and right of the pixel boundary in FIG. 10. Accordingly, the gaps 203 filled with the pixel-inside high refractive-index material are arranged at four points of up, down, left, and right of the pixel boundary. The light-collecting devices can be considered having various configurations other than those shown in FIGS. 9 and 10. However, the gap 203 filled with the high-refractive index material is arranged under the same concept with those shown in FIGS. 9 and 10, avoiding the light-collecting device from reaching a size which cannot be produced in semiconductor manufacturing steps.

Embodiment 9

Figure 11:
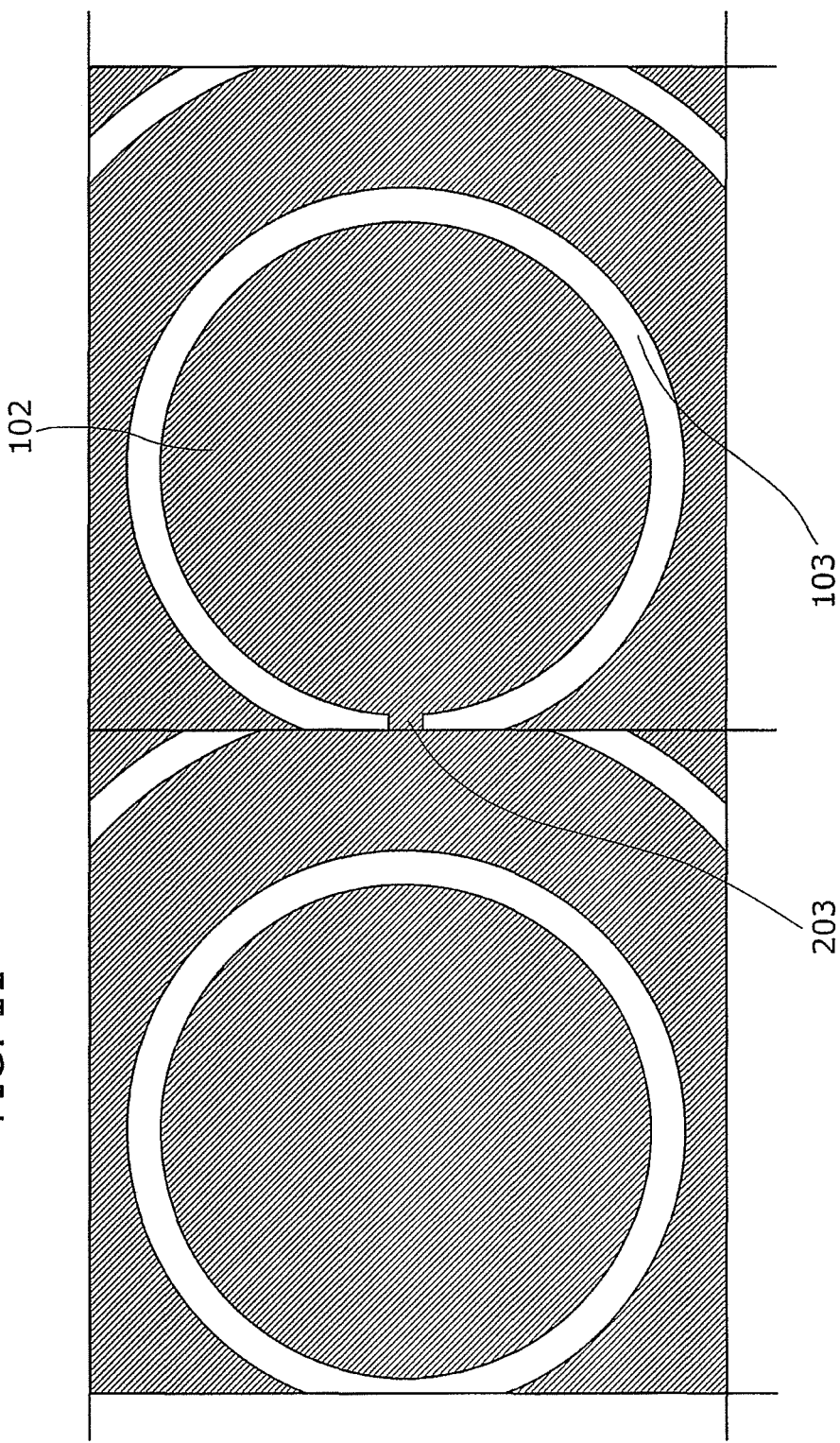
FIG. 11 shows a light-collecting device group according to Embodiment 9 of the present invention.

FIG. 11 shows a light-collecting device group according to Embodiment 9 of the present invention. The pixel-inside air gap 103 and the pixel-inside high refractive index portion 102 each have an approximately circular shape, and are concentrically arranged.

In FIG. 11, a light-collecting device mounted on a left pixel has no gap 203 filled with a high-refractive index material whereas the light-collecting device mounted on a right pixel has the gap 203 filled with the high-refractive index material. This is because the light-collecting device mounted on the left pixel has the center of the concentric circles at a position which is relatively close to the center of a pixel, whereas the light-collecting device on the right pixel has the center of the concentric circles at a position which is relatively far from the center of the pixel. As such, in the case when the center position of the concentric circles varies in each pixel, as described above, the light-collecting device can be stably produced with high yield by determining whether or not the gap 203 filled with the high-refractive index material is provided, in the following manner.

Embodiment 10

Figure 12:
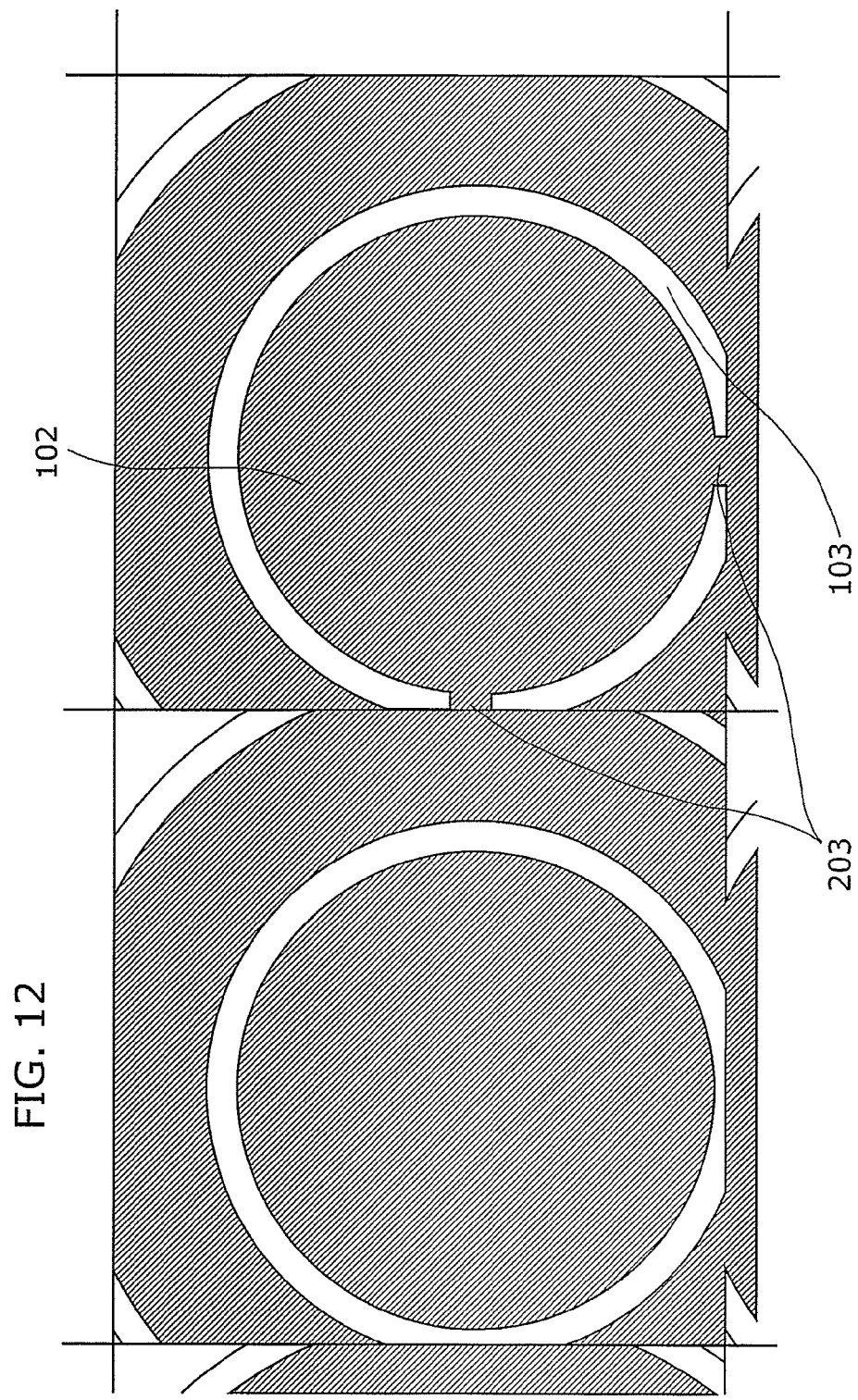
FIG. 12 shows a light-collecting device group according to Embodiment 10 of the present invention.

FIG. 12 shows a light-collecting device group according to Embodiment 10 of the present invention. The pixel-inside air gap 103 and the pixel-inside high refractive index portion 102 each have an approximately circular shape, and are concentrically arranged.

In the present embodiment, the center of the concentric circles is diagonally displaced with respect to the center of a pixel. Accordingly, the gaps 203 need to be arranged at respective two portions. Others are the same with those in Embodiment 9.

Embodiment 11

Figure 13:
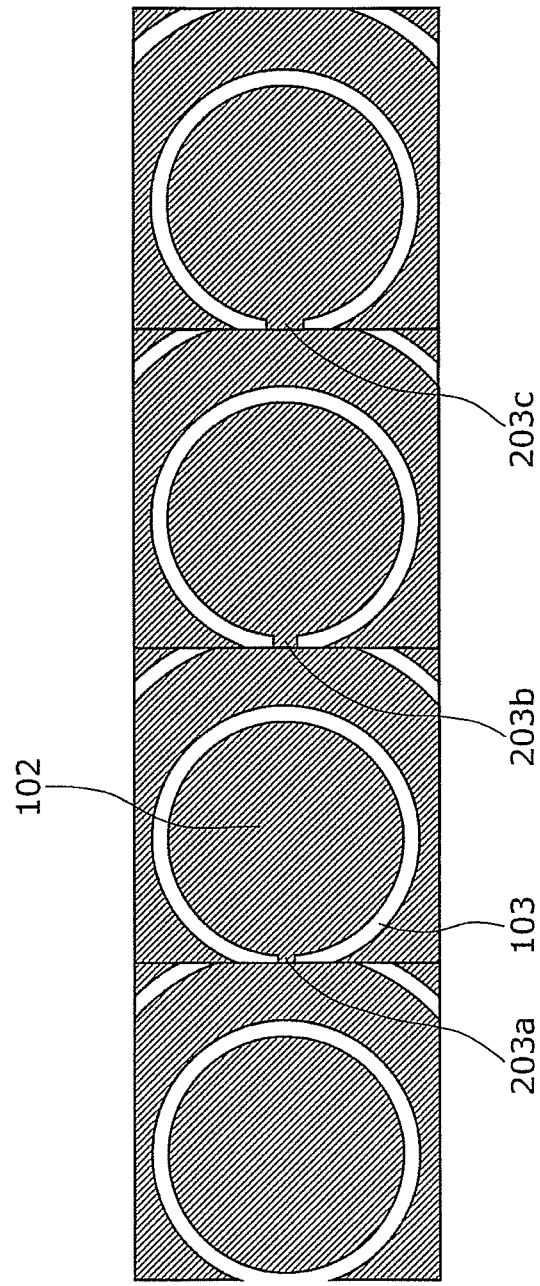
FIG. 13 shows a light-collecting device group according to Embodiment 11 of the present invention.

FIG. 13 shows a light-collecting device group according to Embodiment 11 of the present invention. This diagram shows the light-collecting devices adjacent to each other for four pixels. In the light-collecting device arranged in each of the pixels, the pixel-inside air gap 103 and the pixel-inside high refractive index portion 102 each have an approximately circular shape, and are concentrically arranged.

Like Embodiment 6, widths of the respective gaps 203a, 203b, and 203c each filled with a high refractive-index material gradually varies, allowing the light-collecting device to be stably produced without deteriorating the characteristics thereof.

Embodiment 12

Figure 14:
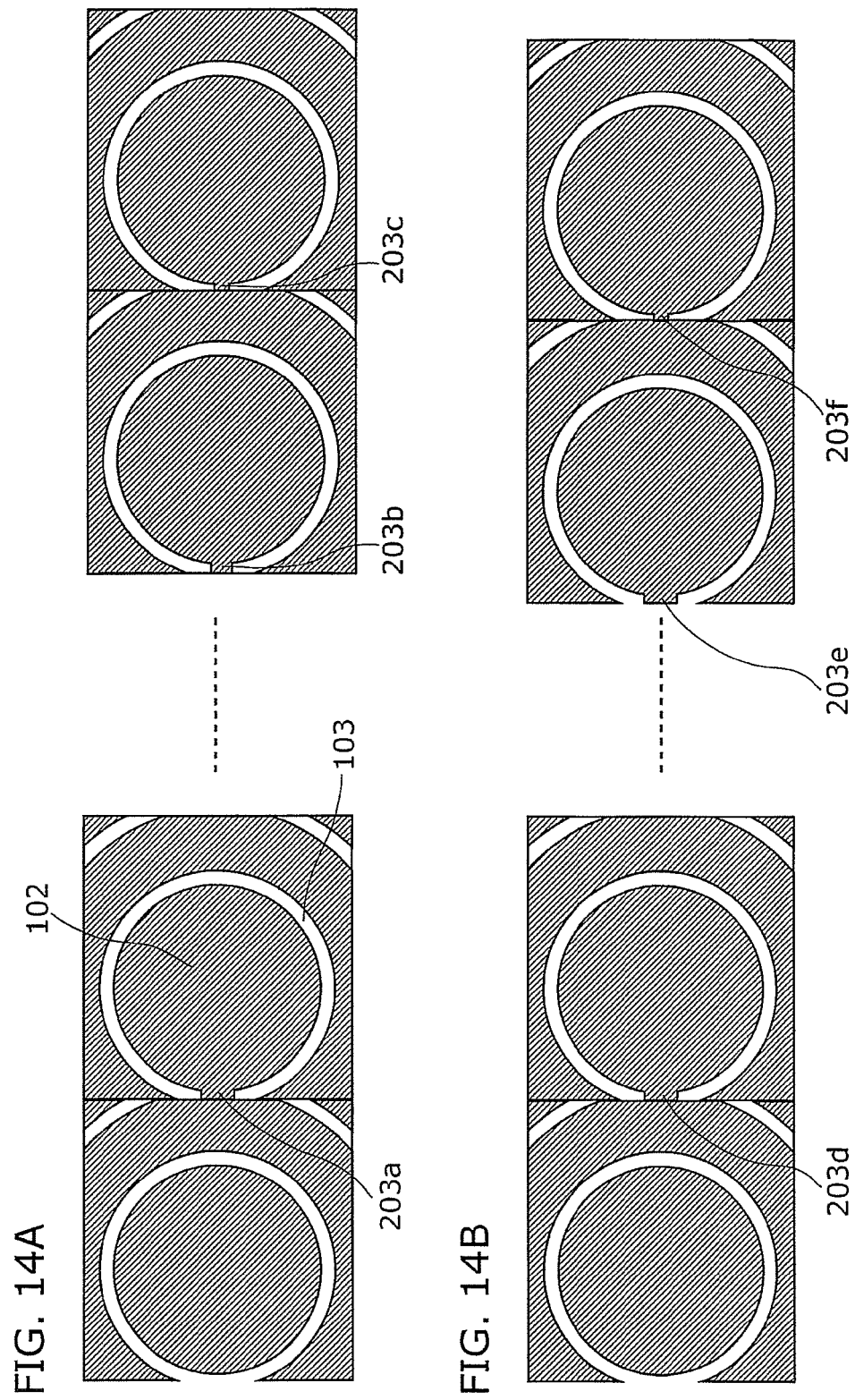
FIGS. 14A and 14B each show a light-collecting device group according to Embodiment 12 of the present invention.

FIG. 14 is a diagram showing a light-collecting device group according to Embodiment 12 of the present invention. This diagram shows the light-collecting devices for four pixels. In the light-collecting device arranged in each pixel in the diagram, FIG. 14A shows gaps 203a, 203b, and 203c, each of which are filled with a high-refractive index material, arranged in the manner described in Embodiment 11. Specifically, the widths of the respective gaps each filled with the high-refractive index material become narrower toward right from 203a, through 203b, to 203c. On the other hand, in FIG. 14B, the widths of the respective gaps 203d, 203e, and 203f each filled with the high-refractive index material do not necessarily become narrower toward the right, though the arrangements shown in FIG. 14B is almost same with those shown in FIG. 14A. However, the gap 203f filled with the high-refractive index material has the width narrower than that of the gap 203d. Considering the four pixels of FIG. 14B with a broad view, the widths of the respective gap decrease in size as the pixels are viewed toward the right like in FIG. 14A. As such, the length of the gaps 203 in the predetermined number of the light-collecting devices aligned in a line monotonically decreases. As described in the above, same effect with those in Embodiment 11 can be obtained in Embodiment 12, if the widths of the respective gaps 203 do not monotonically vary locally, but vary in a broad sense. However, the arrangement manner of air gaps described in Embodiment 12 is considerably different from that in Embodiment 11, causing unevenness and a noise to be superimposed on an output image from a solid-state imaging apparatus. Accordingly, an attention is required.

Embodiment 13

Figure 15:
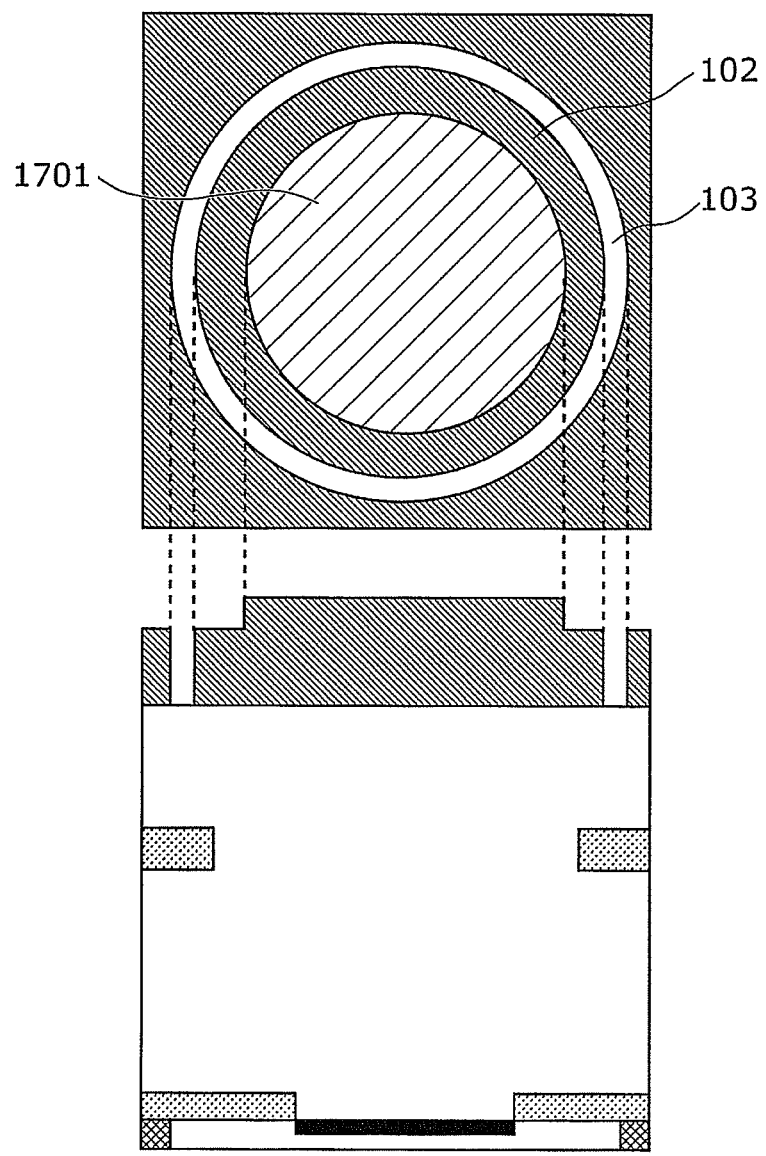
FIG. 15 includes a top view and a cross-sectional view each showing a light-collecting device and a pixel according to Embodiment 13 of the present invention.

FIG. 15 includes a top view and a cross sectional view both showing a pixel having a light-collecting device according to Embodiment 13 of the present invention. The light-collecting device shown in FIG. 15 has a two-stage configuration, and is different from those shown in FIGS. 1, 2, and other diagrams in that a pixel-inside high refractive index portion 1701 in an upper stage of the two-stage configuration is added.

Figure 16:
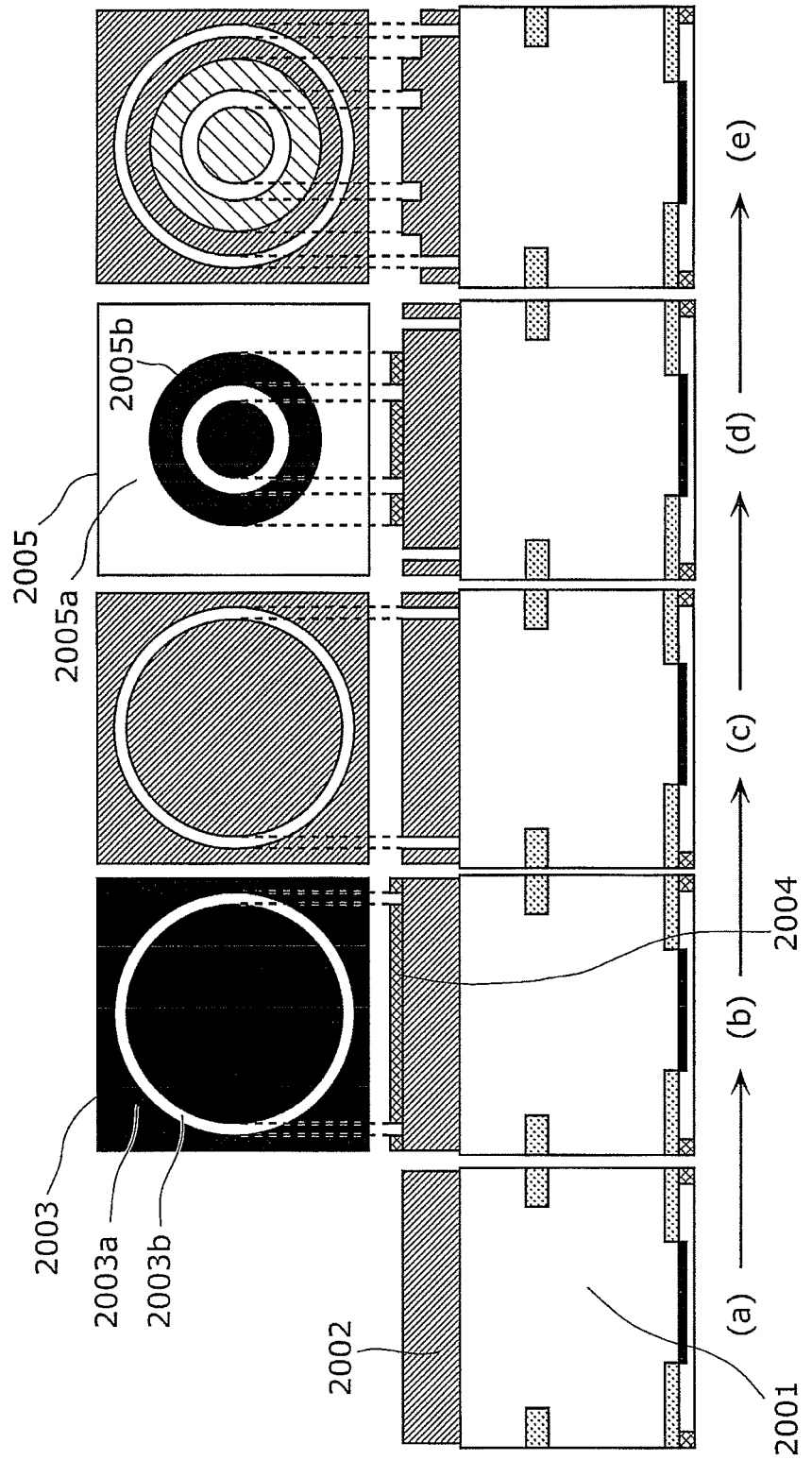
FIG. 16 shows manufacturing steps of a light-collecting device having a two-stage configuration.

A manufacturing method of the light-collecting device having the two-stage configuration shown in FIG. 15 will be described before describing Embodiment 13 of the present invention. FIG. 16 is a diagram showing the manufacturing method of the light-collecting device having the two-stage configuration. Steps progress in the order of FIG. 16(a) to FIG. 16(e). Each of the FIG. 16(a) to FIG. 16(e) shows a cross section of a single pixel of the solid-state imaging apparatus including a light-shielding film and a light-receiving device. The reference numeral 2002 denotes the light-collecting device prior to the completion, and is subjected to a processing as the step shifts from FIG. 16(a) to FIG. 16(e). The reference numeral 2003 denotes a first mask, which includes a light-shielding portion 2003a and a light-transmitting portion 2003b. The reference numeral 2004 denotes a resist. The reference numeral 2005 denotes a second mask, which includes a light-shielding portion 2005a and a light-transmitting portion 2005b.

FIG. 16(a) shows the light-collecting device 2002 to which no processing is applied yet. The light-collecting device 2002 is typically made of a silicon dioxide film and has a thickness at a level of 0.8 μm to 1.5 μm. A resist is applied on an upper surface of the light-collecting device 2002 in FIG. 16(a), followed by being exposed using the first mask 2003. If the resist is a positive type, the resist is formed in a shape, as denoted by 2004 in FIG. 16(b), that an area corresponding to the light-transmitting portion 2003b of the first mask vanishes and an area corresponding to the light-shielding portion 2003a of the first mask remains, after the development.

The light-collecting device 2002 is etched for whole thickness thereof using a method that an etching speed of a material of the light-collecting device 2002 is sufficiently greater than that of the resist under the condition shown in FIG. 16(b). After that, the resist is removed, thereby obtaining a shape shown in FIG. 16(c).

Subsequently, the resist is applied on an upper surface of the light-collecting device shown in FIG. 16(c), followed by being exposed by the second mask 2005 and being developed. Accordingly, the light-collecting device shaped as shown in FIG. 16(d) can be obtained. After that, the light-collecting device 2002 is etched for a predetermined thickness thereof, thereby obtaining a final shape as shown in FIG. 16(e). This etching is performed to a thickness at a level of one-quarter to one-third of the thickness of the light collecting device 2002.

The method similar to those applied to the light-collecting devices described in Embodiments 1 to 12 is applied to the light-collecting device having the two-stage configuration, thereby preventing decrease of yield and variability of characteristics, due to the shape-variability of the light-collecting device.

Hereinafter, some application examples of the light-collecting device having the two-stage configuration will be described.

Figure 17:
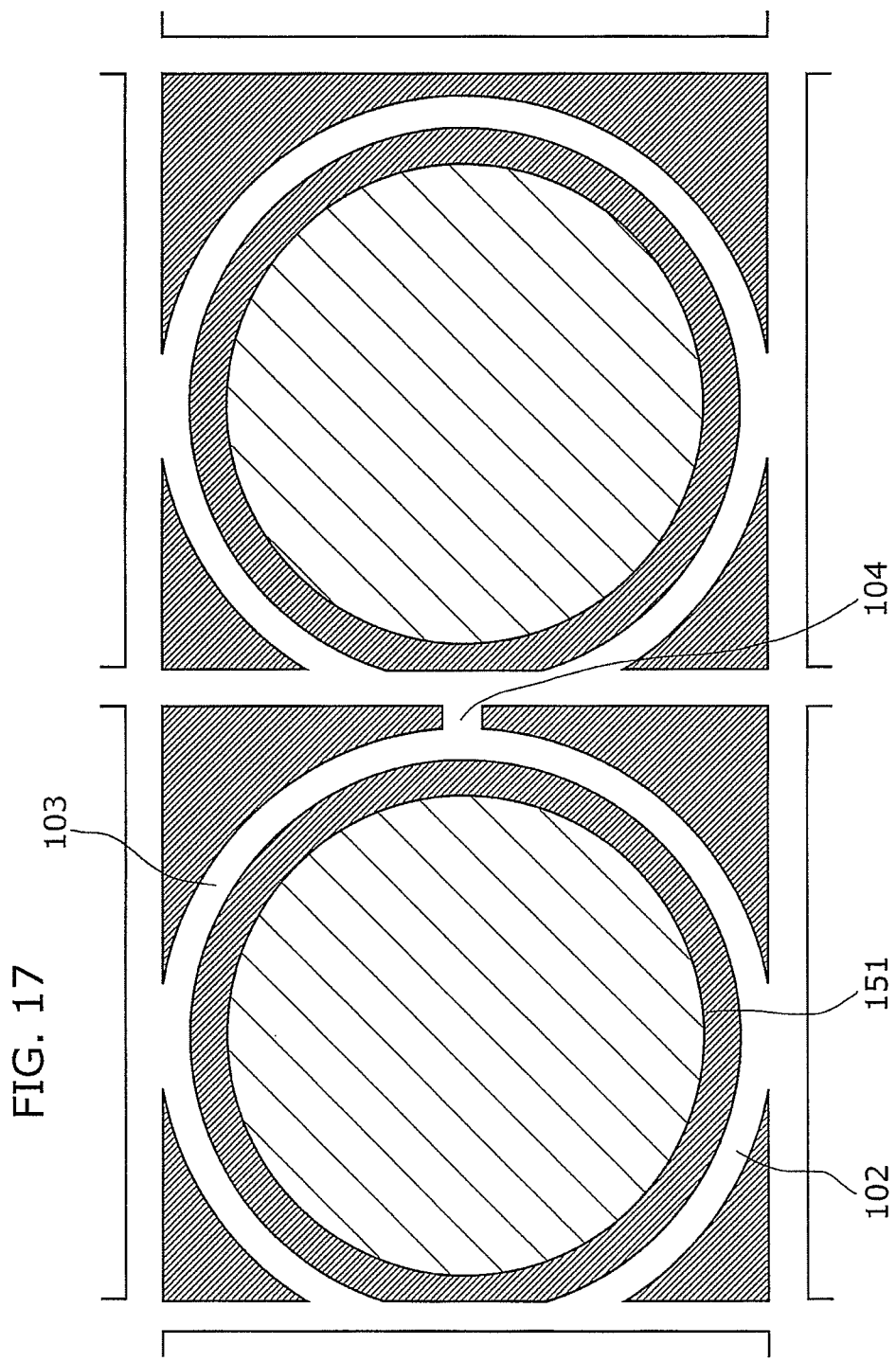
FIG. 17 shows a first application example of some light-collecting devices adjacent to each other.

FIG. 17 shows a first application example of the light-collecting device having the two-stage configuration applied to some light-collecting devices adjacent to each other. A pixel-inside high refractive index portion 151 is placed on an upper stage of the pixel-inside high refractive index portion 102 which is placed on a lower stage. The pixel-inside high refractive index portion 102 in the lower stage has a lower-stage air gap 104. In the light-collecting device shown in FIG. 17, the configuration of the light-collecting device according to Embodiment 1 of the present invention is applied to the pixel-inside high refractive index portion 102 in the lower stage.

Figure 18:
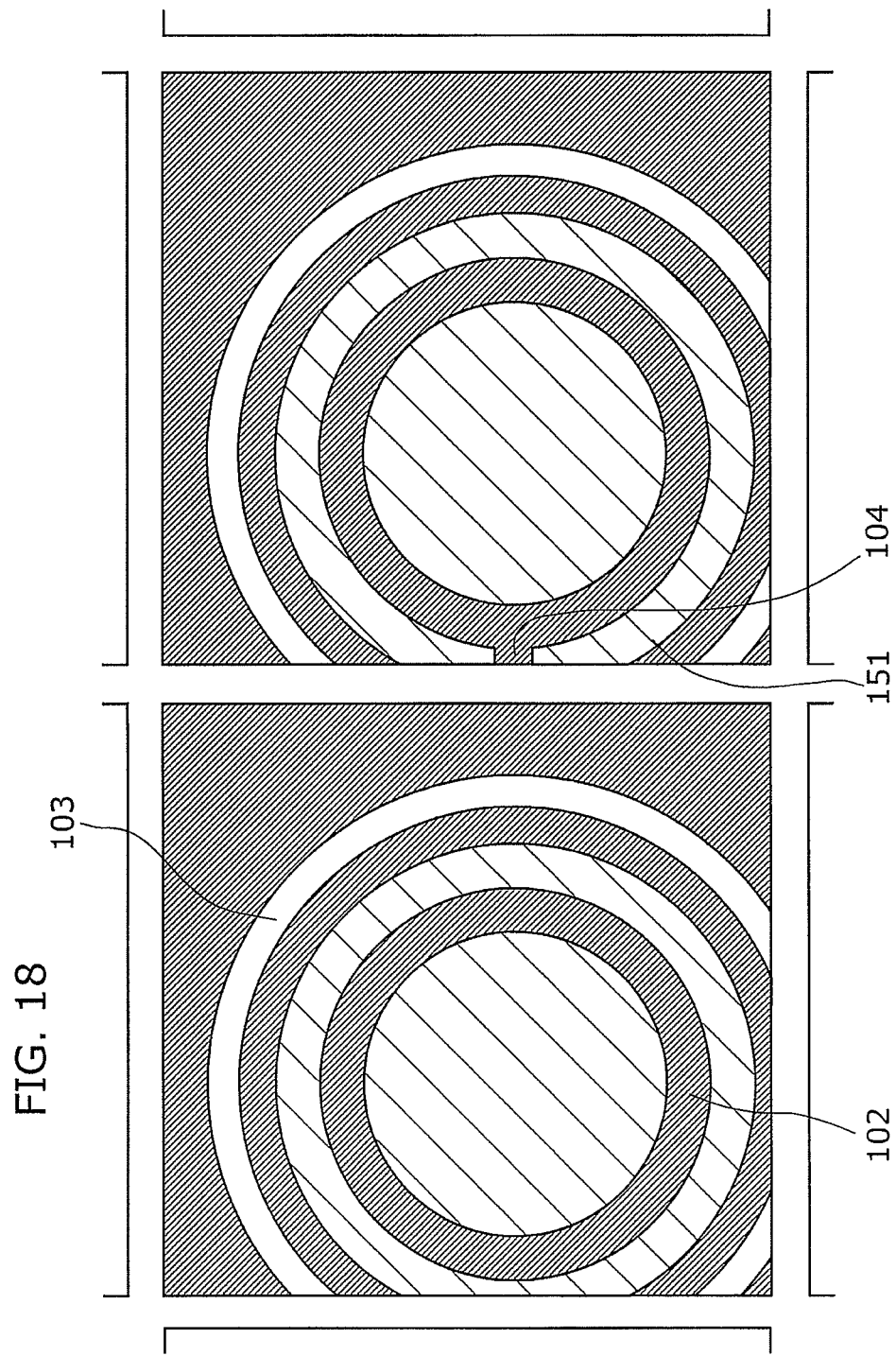
FIG. 18 shows a second application example of some light-collecting devices adjacent to each other.
Figure 19:
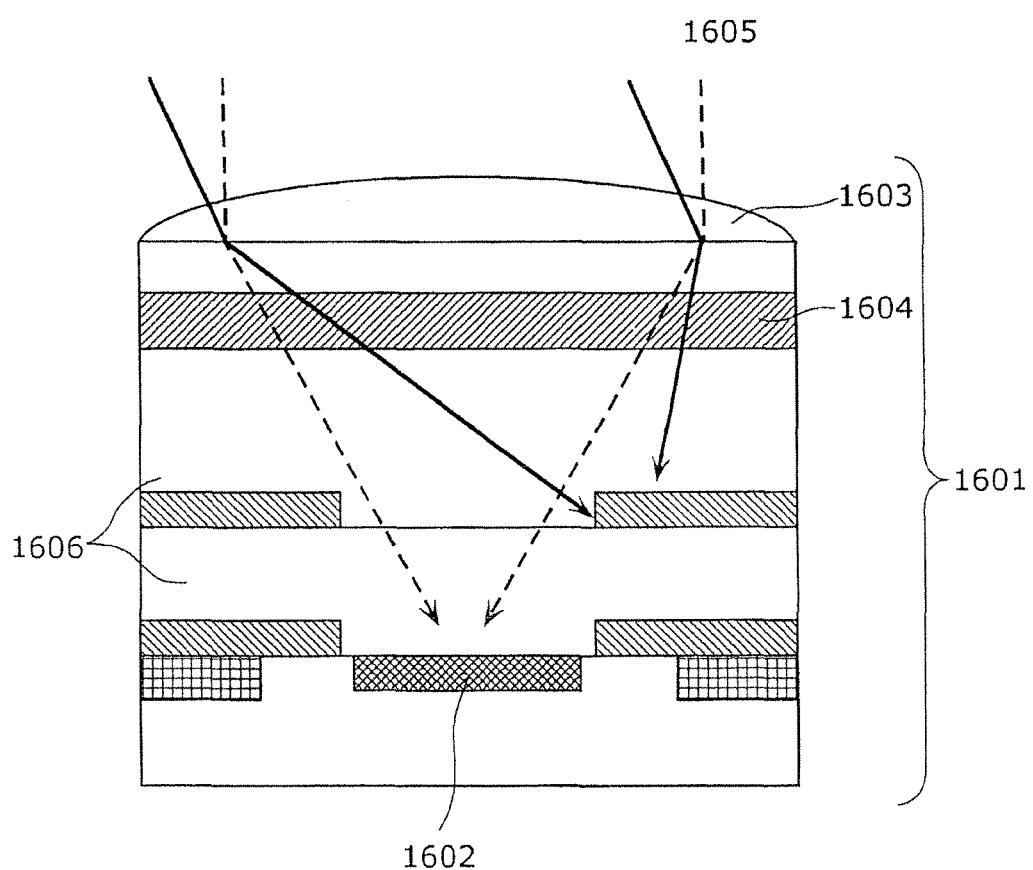
FIG. 19 is a cross-sectional view showing a single pixel in a typical solid-state imaging apparatus according to a conventional technique.
Figure 20B:
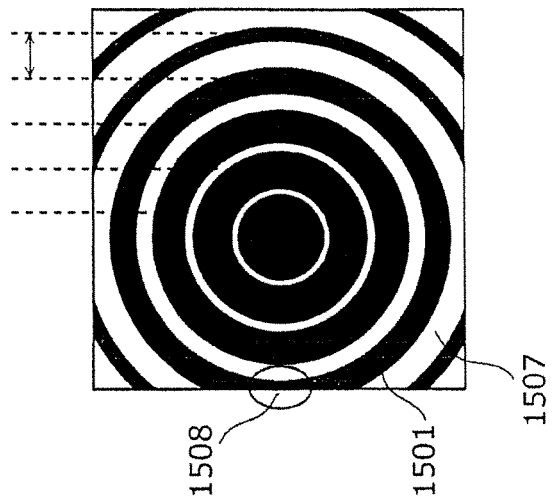
FIGS. 20A and 20B are respectively a cross-sectional view and a top view each showing a light-collecting device according to the conventional technique.
Figure 20A:
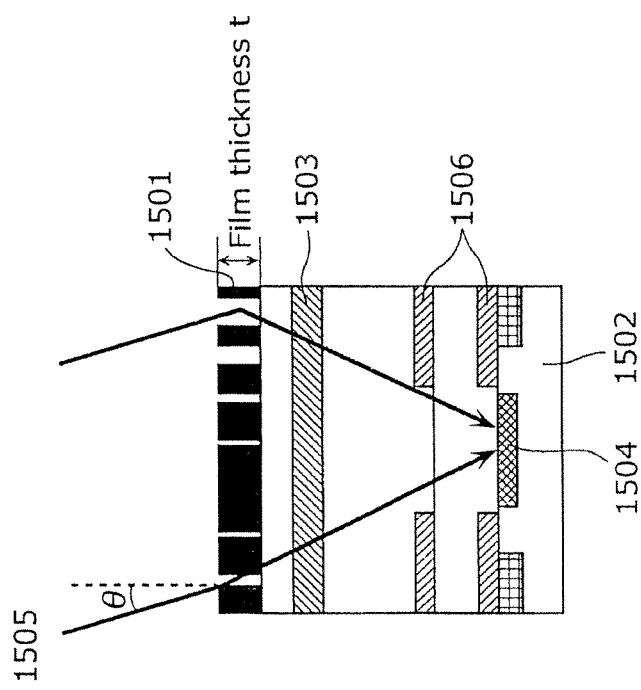

FIG. 18 shows a second application example of the light-collecting device having the two-stage configuration applied to some light-collecting devices adjacent to each other. The pixel-inside high refractive index portion 151 is placed on the upper stage of the pixel-inside high refractive index portion 102 which is placed on the lower stage. The pixel-inside high refractive index portion 151 in the upper stage has an upper-stage air gap 104. In the light-collecting device shown in FIG. 18, the method described with respect to the light-collecting device according to Embodiment 1 of the present invention is applied to the pixel-inside high refractive index portion 151 in the upper stage.

Although only some exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

INDUSTRIAL APPLICABILITY

A light-collecting device according to an embodiment of the present invention can be used in a solid-state imaging apparatus, and is useful. It is further useful for a light-collecting device having a minute concentric configuration.

What is claimed is:

1. A light-collecting device comprising
at least one first annular region having a first refractive index, and at least one second annular region having a second refractive index different from the first refractive index, said at least one first annular region and said at least one second annular region being adjacently and alternately arranged in a concentric manner,
wherein at least one of said at least one first annular region and said at least one second annular region includes a gap at a portion where a width of said at least one of said at least one first annular region and said at least one second annular region gradually decreases.

2. The light-collecting device according to claim 1,
wherein at least one of said at least one first annular region and said at least one second annular region has a two-stage configuration, and
the gap is provided in a lower stage or an upper stage of the two-stage configuration.

3. The light-collecting device according to claim 1,
wherein opposing end surfaces of the gap are approximately parallel to each other.

4. The light-collecting device according to claim 1,
wherein said at least one first annular region is made of a material having a high-refractive index higher than a refractive index of air,
said at least one second annular region is formed by the air,
at least one of said at least one first annular region includes the gap, and
the gap is an air gap and connected to an adjacent one of said at least one second annular region.

5. The light-collecting device according to claim 1,
wherein said at least one first annular region is made of a material having a high-refractive index higher than a refractive index of air,
said at least one second annular region is formed by the air,
at least one of said at least one second annular region includes the gap, and
the gap is filled with the material having the high-refractive index and connected to an adjacent one of said at least one first annular region.

6. The light-collecting device according to claim 1, wherein an area of the gap is equal to or less than 3% of an area of said light-collecting device.

7. A light-collecting device group comprising:
a first light-collecting device which is the light-collecting device according to claim 4; and
a second light-collecting device including at least one first annular region having a first refractive index, at least one second annular region having a second refractive index different from the first refractive index, and not including the gap, said at least one first annular region and said at least one second annular region being adjacently and alternately arranged in a concentric manner,
wherein said first light-collecting device and said second light-collecting device are arranged adjacent to each other across a boundary.

8. A light-collecting device group comprising:
a first light-collecting device which is the light-collecting device according to claim 4; and
a second light-correcting device which is the light-collecting device according to claim 4,
wherein a length of the gap of said first light-collecting device is different from a length of the gap of said second light-collecting device.

9. A light-collecting device group comprising:
a plurality of the light-collecting devices according to claim 4,
wherein a length of the gap in a predetermined number of said light-collecting devices arranged in a line varies monotonically.

10. A light-collecting device group comprising:
a first light-collecting device which is the light-collecting device according to claim 5; and
a second light-collecting device including at least one first annular region having a first refractive index, and at least one second annular region having a second refractive index different from the first refractive index, and not including the gap, said at least one first annular region and said at least one second annular region being adjacently and alternately arranged in a concentric manner,
wherein said first light-collecting device and said second light-collecting device are adjacently arranged.

11. A light-collecting device group comprising:
a first light-collecting device which is the light-collecting device according to claim 5; and
a second light-collecting device which is the light-collecting device according to claim 5,
wherein a length of the gap of said first light-collecting device is different from a length of the gap of said second light-collecting device.

12. A light-collecting device group comprising
a plurality of light-collecting devices according to claim 5,
wherein a length of the each gap in a predetermined number of said light-collecting devices arranged in a line varies monotonically.

13. A solid-state imaging apparatus comprising:
an imaging area including a plurality of light-receiving devices; and
a plurality of light-collecting devices respectively associated with said light-receiving devices,
wherein said light-collecting devices include said light-collecting device according to claim 1.

14. The solid-state imaging apparatus according to claim 13,
wherein a center position of each of said light-collecting devices is displaced from a center position corresponding one of said light-receiving devices,
an amount of the displacement depends on a position of said light-collecting device in the imaging area, and
a length of the gap depends on the position of said light-collecting device in the imaging area.

* * * * *